(12) United States Patent
Cho et al.

(10) Patent No.: US 11,177,390 B2
(45) Date of Patent: Nov. 16, 2021

(54) TRANSISTOR HAVING VERTICAL STRUCTURE AND ELECTRIC DEVICE

(71) Applicant: LG DISPLAY CO., LTD., Seoul (KR)

(72) Inventors: InTak Cho, Gyeonggi-do (KR); JungSeok Seo, Daejeon (KR); SeHee Park, Seoul (KR); Jaeyoon Park, Gyeonggi-do (KR); SangYun Sung, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/574,725

(22) Filed: Sep. 18, 2019

(65) Prior Publication Data

US 2020/0161475 A1    May 21, 2020

(30) Foreign Application Priority Data

Nov. 20, 2018  (KR) .................. 10-2018-0143817

(51) Int. Cl.
*H01L 29/786* (2006.01)
*H01L 27/12* (2006.01)
*H01L 29/10* (2006.01)

(52) U.S. Cl.
CPC .... *H01L 29/78642* (2013.01); *H01L 27/1225* (2013.01); *H01L 29/1037* (2013.01); *H01L 29/78663* (2013.01)

(58) Field of Classification Search
CPC .............. H01L 29/78642; H01L 29/78696
See application file for complete search history.

(56) References Cited

U.S. PATENT DOCUMENTS 6,144,422 A  11/2000 Lee
9,620,611 B1  4/2017 Clifton et al.
(Continued)

FOREIGN PATENT DOCUMENTS

GB    2 441 355 A    3/2008
JP    60-1868 A      1/1985
(Continued)

*Primary Examiner* — Michele Fan
(74) *Attorney, Agent, or Firm* — Birch, Stewart, Kolasch & Birch, LLP

(57) ABSTRACT

An electronic device can include a panel; a driver circuit configured to drive the panel; and a transistor disposed in the panel, the transistor including a first electrode disposed on a substrate, an insulation pattern disposed on the substrate, the insulation pattern overlapping with an edge of the first electrode, a second electrode disposed on an upper surface of the insulation pattern, an active layer disposed on the first electrode, the insulation pattern and the second electrode, a gate insulating film disposed on the active layer, and a gate electrode disposed on the gate insulating film, in which a first portion of the active layer overlaps with the first electrode, a second portion of the active layer overlaps with the second electrode, and a channel area of the active layer is between the first portion of the active layer and the second portion of the active layer, and the channel area includes a first channel portion disposed along a side surface of the insulation pattern, and a second channel portion disposed on a portion of the upper surface of the insulation pattern, the second channel portion extending from an edge of the second electrode to the first channel portion.

20 Claims, 17 Drawing Sheets

(56) References Cited

U.S. PATENT DOCUMENTS

| | | | |
|---|---|---|---|
| 2004/0245524 | A1 | 12/2004 | Hirakata et al. |
| 2006/0175609 | A1 | 8/2006 | Chan et al. |
| 2013/0161732 | A1 | 6/2013 | Hwang et al. |
| 2014/0332769 | A1* | 11/2014 | Lee ............... H01L 27/3272 257/40 |
| 2015/0243203 | A1 | 8/2015 | Kim et al. |
| 2016/0365369 | A1 | 12/2016 | Ellinger et al. |
| 2016/0365370 | A1* | 12/2016 | Ellinger ......... H01L 29/78642 |
| 2017/0005200 | A1* | 1/2017 | Sasaki ............. H01L 27/1222 |
| 2017/0148888 | A1 | 5/2017 | Clark et al. |
| 2019/0148548 | A1* | 5/2019 | Kao ..................... H01L 29/45 257/401 |

FOREIGN PATENT DOCUMENTS

| | | |
|---|---|---|
| JP | 2-140863 U | 11/1990 |
| JP | 10-321865 A | 12/1998 |
| JP | 2004-304182 A | 10/2004 |
| JP | 2009-535805 A | 10/2009 |
| JP | 2010-503192 A | 1/2010 |
| JP | 2017-17208 A | 1/2017 |
| JP | 2020-512678 A | 4/2020 |
| WO | WO 2008/025989 A2 | 3/2008 |

\* cited by examiner

CTA (Contact Area)

TRANSISTOR HAVING VERTICAL STRUCTURE AND ELECTRIC DEVICE

CROSS REFERENCE TO RELATED APPLICATION

This application claims priority to Korean Patent Application No. 10-2018-0143817, filed in the Republic of Korea on Nov. 20, 2018, which is hereby incorporated by reference for all purposes as if fully set forth herein.

BACKGROUND

Field

Example embodiments relate to a transistor having a vertical structure and an electronic device.

Description of Related Art

In response to the development of the information society, a variety of demands for a range of electronic devices, such as a display device and a lighting device, are increasing. Such an electronic device may include a panel in which data lines and gate lines are disposed, a data driver driving the data lines, and a gate driver driving the gate lines.

A panel, a key component of an electronic device may include a large number of transistors having a variety of functions to drive the panel.

Accordingly, panel fabrication processing may inevitably be complicated and difficult. However, if ease of processing is pursued, the performance of transistors may be degraded, which is problematic.

In addition, transistors should have high levels of integration to realize superior characteristics in electronic devices, such as high resolution. However, the size of transistors cannot be endlessly reduced, due to problems associated with processing, design, and the like. Therefore, it is desirable to adjust an area occupied by transistors without degrading the characteristics of transistors.

BRIEF SUMMARY

Various aspects of the present disclosure provide a transistor having a vertical structure and an electronic device, in which a short channel and integration can be realized.

Also provided are a transistor having a vertical structure and an electronic device, in which an operating margin is increased due to a high S-factor of the transistor.

Also provided are a transistor having a vertical structure and an electronic device, in which an active layer has no break, e.g., no discontinuity in an electrical circuit.

Also provided are a transistor having a vertical structure and an electronic device, in which an ultra-high resolution panel can be realized due to a reduced device area.

Also provided are a transistor having a vertical structure and an electronic device, in which the driving current of the transistor can be increased, while the size of a non-active area can be reduced.

Example embodiments can provide an electronic device including: a panel and a driver circuit driving the panel.

In the an electronic device, example embodiments can provide a transistor disposed in the panel, the transistor including: a first electrode disposed on a substrate; an insulation pattern disposed on the substrate and overlapping one end of the first electrode; a second electrode disposed on a portion of a top surface of the insulation pattern; an active layer disposed on the first electrode, the insulation pattern, and the second electrode; a gate insulating film disposed on the active layer; and a gate electrode disposed on the gate insulating film. One end of the active layer overlaps the first electrode, the other end of the active layer overlaps the second electrode, and a channel area is provided in a portion of the active layer that does not overlap either the first electrode or the second electrode. The channel area includes a first portion comprised of an area corresponding to a side surface of the insulation pattern and a second portion extending from the first portion and comprised of an area overlapping a portion of the top surface of the insulation pattern without overlapping the second electrode. The thickness of a portion of the gate insulating film, in the area corresponding to the side surface of the insulation pattern, is thinner than the thickness of a portion of the gate insulating film, in the area overlapping the second portion of the top surface of the insulation pattern without overlapping the second electrode.

The insulation pattern can include an area in which the width thereof increases in a direction perpendicularly away from the substrate.

The length of the channel area of the active layer can be proportional to the height of the insulation pattern.

The gate insulating film can include a first gate insulating film disposed on a top surface of the active layer to overlap a portion of the first electrode and a portion or entirety of the second electrode; and a second gate insulating film disposed on the first gate insulating film to overlap the channel area of the active layer.

The first gate insulating film can expose a portion or entirety of the active layer disposed on the side surface of the insulation pattern.

The first gate insulating film can include a first area and a second area, the first area overlapping the one end of the active layer and a portion of the first electrode, and the second area overlapping the other end of the active layer and the portion or entirety of the second electrode.

The second area can be disposed on a portion of the channel area of the active area overlapping a portion of the insulation pattern without overlapping the second electrode.

A thickest area of the second gate insulating film can be thinner than a thickest area of the first gate insulating film.

The electronic device can further include an intermediate layer disposed on the first electrode, the insulation pattern, and the second electrode and below the active layer.

The intermediate layer can be an inorganic film having a thickness of 10 Å to 30 Å.

The thickness of the intermediate layer can be thinner than the thickness of either the first gate insulating film or the second gate insulating film.

In a situation in which the transistor is disposed in an active area, a passivation layer can cover the gate electrode of the transistor, and a pixel electrode can be located on the passivation layer to be electrically connected to the first electrode or the second electrode through a hole in the passivation layer. A data voltage can be applied to the gate electrode.

The transistor can be disposed in each area of a plurality of subpixels in the active area of the panel.

The transistor can be included in a gate driver circuit disposed in a non-active area of the panel, in the periphery of the active area.

In the transistor having a vertical structure and the electronic device according to example embodiments, a short channel and integration can be realized.

In the transistor having a vertical structure and the electronic device according to example embodiments, an operating margin is increased due to a high S-factor of the transistor.

In the transistor having a vertical structure and the electronic device according to example embodiments, the active layer has no break.

In the transistor having a vertical structure and the electronic device according to example embodiments, an ultra-high resolution panel can be realized due to a reduced device area.

In the transistor having a vertical structure and the electronic device according to example embodiments, the driving current of the transistor can be increased, while the size of a non-active area can be reduced.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION

Figure 1:
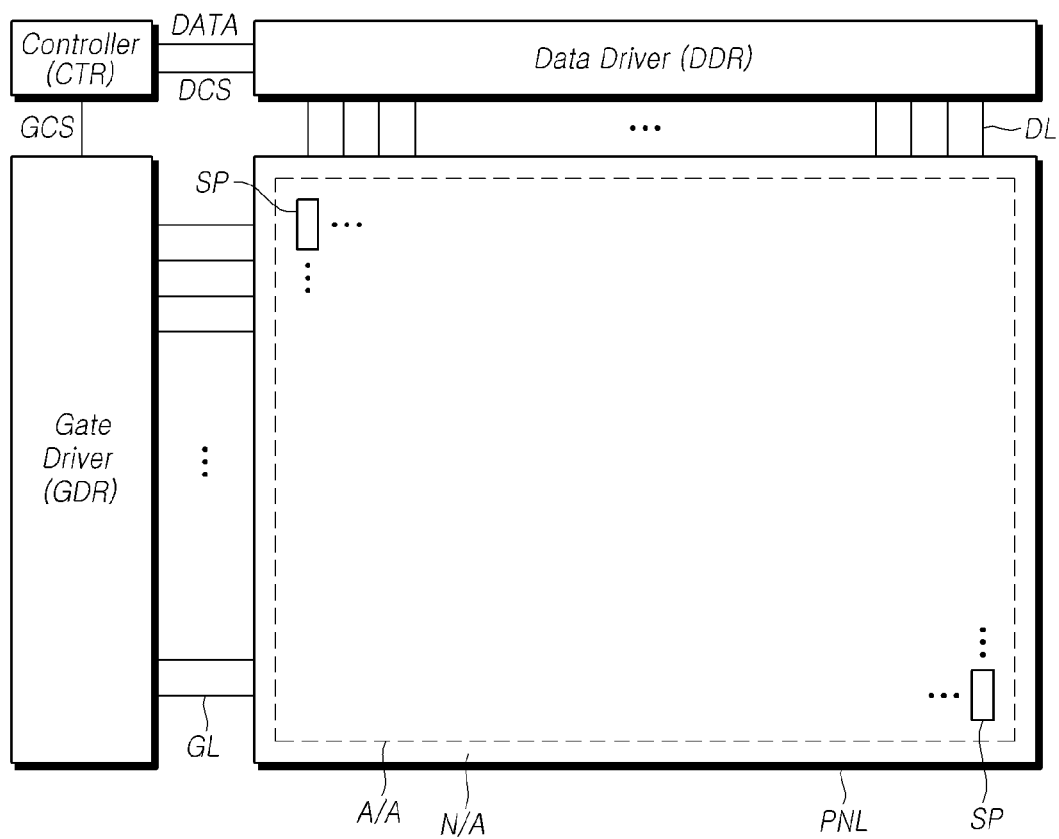
FIG. 1 illustrates a schematic configuration of an electronic device according to embodiments.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person having ordinary skill in the art. The scope of the present disclosure shall be defined by the appended Claims.

The shapes, sizes, ratios, angles, numbers, and the like, inscribed in the drawings to illustrate example embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on," "above," "under," or "next to" another element, not only can it be directly located on or under the other element, but it can also be indirectly located on or under the other element via an intervening element.

In addition, terms, such as "first" and "second" may be used herein to describe a variety of components. It should be understood, however, that these components are not limited by these terms. These terms are merely used to discriminate one element or component from other elements or components. Thus, a first element referred to as first hereinafter may be a second element within the spirit of the present disclosure.

The features (or components) of example embodiments of the present disclosure may be partially or entirely coupled or combined with each other and may work in concert with each other or may operate in a variety of technical methods. In addition, respective embodiments may be carried out independently or may be associated with and carried out in concert with other embodiments.

Hereinafter, example embodiments will be described in detail with reference to the accompanying drawings. FIG. 1 illustrates a schematic configuration of an electronic device according to embodiments.

The electronic device according to embodiments can include a display device, a lighting device, a light-emitting device, and the like. The following description will mainly be focused on the display device for the sake of brevity. However, the following description can be applied not only to the display device, but also to various other electronic devices, such as the lighting device or the light-emitting device, in substantially the same manner, as long as transistors are included.

The electronic device according to embodiments can include a panel PNL displaying images or emitting light and driver circuits driving the panel PNL.

In the panel PNL, a plurality of data lines DL and a plurality of gate lines GL can be disposed, and a plurality of subpixels SP, defined by intersections of the plurality of gate lines and the plurality of data lines, can be arrayed in the form of a matrix.

In the panel PNL, the plurality of data lines DL and the plurality of gate lines GL can be disposed to intersect each other. For example, the plurality of gate lines GL can be arrayed in rows or columns, while the plurality of data lines DL can be arrayed in columns or rows. In the following description, the plurality of gate lines GL will be regarded as being arrayed in rows, while the plurality of data lines DL will be regarded as being arrayed in columns, for the sake of brevity.

Various signal lines, other than the plurality of data lines DL and the plurality of gate lines GL, can be disposed in the panel PNL, depending on the subpixel structure or the like. Driving voltage lines, reference voltage lines, common voltage lines, and the like can further be disposed.

The panel PNL can be one of various types of panels, such as a liquid crystal display (LCD) panel and an organic light-emitting diode (OLED) panel.

Types of signal lines disposed in the panel PNL can vary depending on the subpixel structure, the panel type (e.g., an LCD panel or an OLED panel), or the like. In addition, the term "signal lines" used herein can conceptually include electrodes to which signals are applied.

The panel PNL can include an active area A/A in which images are displayed and a non-active area N/A in which no images are displayed, the non-active area N/A being located in the periphery of the active area A/A. Herein, the non-active area N/A is also referred to as a bezel area.

The plurality of subpixels SP are displaying images are disposed in the active area A/A.

A pad assembly can be disposed in the non-active area N/A, with a data driver DDR being electrically connected to the pad assembly. A plurality of data link lines connecting the pad assembly and the plurality of data lines DL can be disposed in the non-active area N/A. Herein, the plurality of data link lines can be extensions of the plurality of data lines DL into the non-active area N/A or separate patterns electrically connected to the plurality of data lines DL.

In addition, gate driving-related lines may be disposed in the non-active area N/A to transfer voltages (or signals) for gate driving to a gate driver GDR via the pad assembly to which the data driver DDR is electrically connected. For example, the gate driving-related lines can include clock lines, through which clock signals are transferred, gate voltage lines, through which gate voltages VGH and VGL are transferred, gate driving control signal lines, through which a variety of control signals for the generation of a scanning signal are transferred, and the like. These gate driving-related lines are disposed in the non-active area N/A, unlike the gate lines GL disposed in the active area A/A.

The driver circuits driving the plurality of data lines DL can include the data driver DDR driving the plurality of data lines DL, the gate driver GDR driving the plurality of gate lines GL, a controller CTR controlling the data driver DDR and the gate driver GDR, and the like.

The data driver DDR can drive the plurality of data lines DL by outputting data voltages to the plurality of data lines DL.

The gate driver GDR can drive the plurality of gate lines GL by outputting a scanning signal to the plurality of gate lines GL.

The controller CTR can control the driving operations of the data driver DDR and the gate driver GDR by supplying a variety of control signals DCS and GCS for the driving operations of the data driver DDR and the gate driver GDR. In addition, the controller CTR can supply image data DATA to the data driver DDR.

The controller CTR starts scanning at points in time realized by respective frames, converts image data input from an external source into image data DATA having a data signal format readable by the data driver DDR, outputs the converted image data DATA, and controls data driving at appropriate points in time according to the scanning.

The controller CTR receives timing signals, including a vertical synchronization signal Vsync, a horizontal synchronization signal Hsync, an input data enable signal DE, a clock signal CLK, and the like, from an external source (e.g., a host system), generates a variety of control signals, and outputs the variety of control signals to the data driver DDR and the gate driver GDR, in order to control the data driver DDR and the gate driver GDR.

For example, the controller CTR outputs a variety of gate control signals GCS, including a gate start pulse GSP, a gate shift clock GSC, a gate output enable signal GOE, and the like, to control the gate driver GDR.

In addition, the controller CTR outputs a variety of data control signals DCS, including a source start pulse SSP, a source sampling clock SSC, a source output enable signal SOE, and the like, to control the data driver DDR.

The controller CTR can be a timing controller used in a typical display device, or can be a control device including a timing controller and performing other control functions.

The controller CTR can be provided as a component separate from the data driver DDR, or can be provided as an integrated circuit (IC) integrated (or combined) with the data driver DDR.

The data driver DDR receives image data DATA from the controller CTR and supplies data voltages to the plurality of data lines DL to drive the plurality of data lines DL. The data driver DDR is also referred to as a source driver.

The data driver DDR can send and receive a variety of signals to and from the controller CTR via a variety of interfaces.

The gate driver GDR sequentially drives the plurality of gate lines GL by sequentially supplying a scanning signal to the plurality of gate lines GL. Herein, the gate driver GDR is also referred to as a scan driver.

The gate driver GDR sequentially supplies the scanning signal having an on or off voltage to the plurality of gate lines GL, under the control of the controller CTR.

If a specific gate line is opened by the gate driver GDR, the data driver DDR converts the image data DATA, received from the controller CTR, into analog data voltages, and supplies the data voltages to the plurality of data lines DL.

The data driver DDR can be disposed on one side of the panel PNL (e.g., above or below the panel PNL). In some situations, the data driver DDR can be disposed on both sides of the panel PNL (e.g., above and below the panel PNL), depending on the driving system, the design of the panel, or the like.

The gate driver GDR can be disposed on one side of the panel PNL (e.g., to the right or left of the panel PNL). In some situations, the gate driver GDR can be disposed on both sides of the panel PNL (e.g., to the right and left of the panel PNL), depending on the driving system, the design of the panel, or the like.

The data driver DDR can include one or more source driver ICs (SDICs).

Each of the source driver ICs can include a shift register, a latch circuit, a digital-to-analog converter (DAC), an output buffer, and the like. In some situations, the data driver DDR can further include one or more analog-to-digital converters (ADCs).

Each of the source driver ICs can be connected to a bonding pad of the panel PNL by tape-automated bonding (TAB) or by a chip-on-glass (COG) method, or can directly mounted on the panel PNL. In some situations, each of the source driver ICs can be integrated with the panel PNL. In addition, each of the source driver ICs can be implemented using a chip-on-film (COF) structure. In this situation, each of the source driver ICs can be mounted on a circuit film to be electrically connected to the data lines DL in the panel PNL via the circuit film.

The gate driver GDR can include a plurality of gate driver circuits (GDCs). Herein, the plurality of gate driver circuits may correspond to the plurality of gate lines GL, respectively.

Each of the gate driver circuits can include a shift register, a level register, and the like.

Each of the gate driver circuits can be connected to a bonding pad of the panel PNL by TAB or by a COG method. In addition, each of the gate driver circuits can be implemented using a COF structure. In this situation, each of the gate driver circuits can be mounted on a circuit film to be electrically connected to the gate lines GL in the panel PNL via the circuit film. In addition, each of the gate driver circuits can be implemented using gate-in-panel (GIP) structure disposed within the panel PNL. That is, each of the gate driver circuits can be directly provided in the panel PNL.

Figure 2:
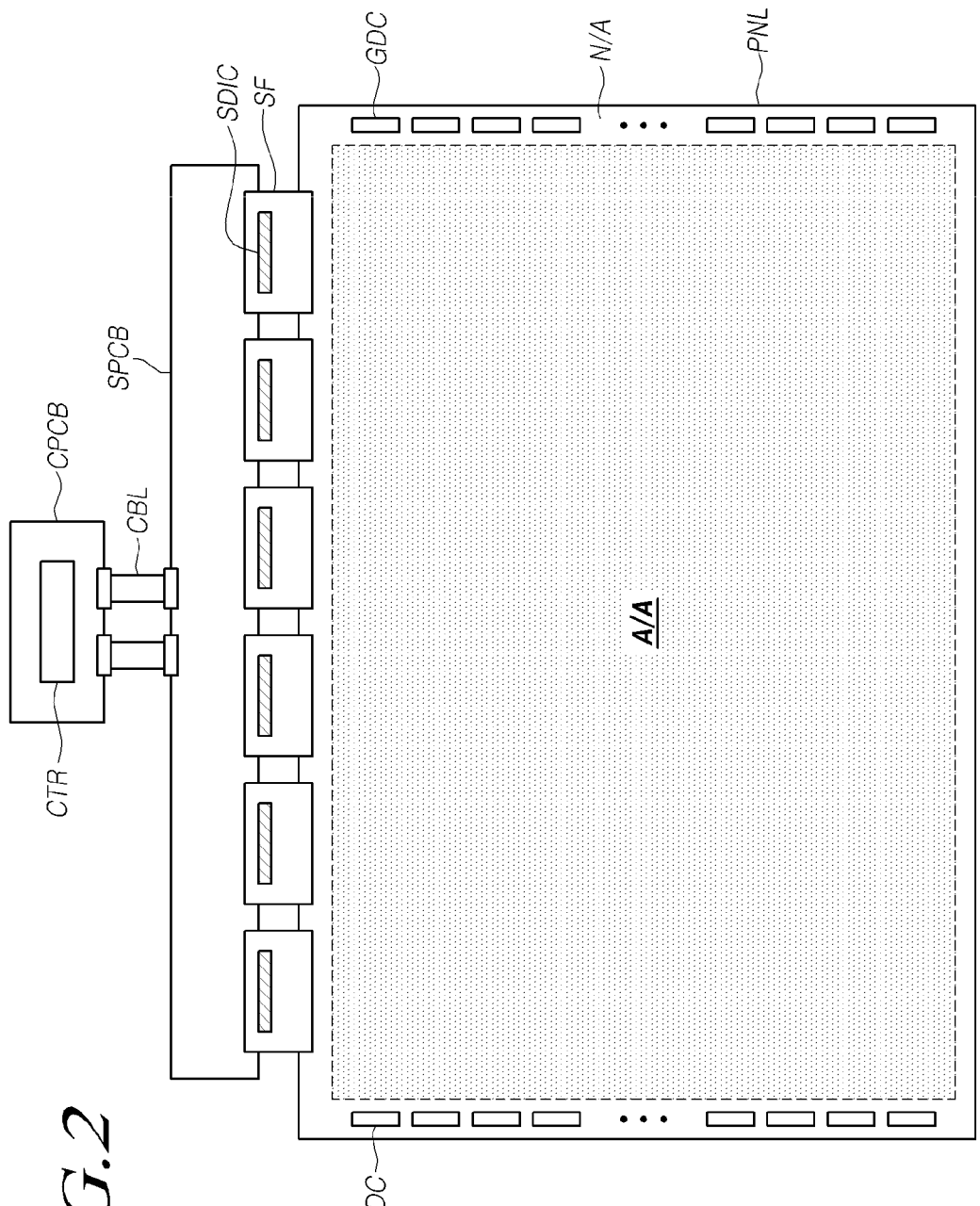
FIG. 2 illustrates a system of the electronic device according to embodiments.

FIG. 2 illustrates a system of the electronic device according to embodiments.

Referring to FIG. 2, in the electronic device according to embodiments, the data driver DDR can be implemented using a COF structure among a plurality of structures, such as a TAB structure, a COG structure, and a COF structure, while the gate driver GDR can be implemented using a GIP structure among a variety of structures, such as a TAB structure, a COG structure, a COF structure, and a GIP structure.

The data driver DDR can be comprised of one or more source driver ICs SDIC. In FIG. 2, the data driver DDR is illustrated as being comprised of a plurality source driver ICs SDIC.

In a situation in which the data driver DDR has the COF structure, each of the source driver ICs SDIC of the data driver DDR can be mounted on a corresponding one of source-side circuit films SF.

One portion of each of the source-side circuit films SF can be electrically connected to the pad assembly (e.g., the assembly of pads) present in the non-active area N/A of the panel PNL.

Lines, electrically connecting the source driver ICs SDIC and the panel PNL, can be disposed on the source-side circuit films SF.

The electronic device can include at least one source printed circuit board SPCB and a control printed circuit board CPCB, on which control components and a variety of electric devices are mounted, in order to circuitry-connect the plurality of source driver ICs SDIC to the other devices.

The other portion of each of the source-side circuit films SF, on which the source driver IC SDICs are mounted, can be connected to the at least one source printed circuit board SPCB.

That is, one portion of each of the source-side circuit films SF, on which the source driver ICs SDIC are mounted, can be electrically connected to the non-active area N/A of the panel PNL, while the other portion of each of the source-side circuit films SF can be electrically connected to the source printed circuit board SPCB.

The controller CTR, controlling the operation of the data driver DDR, the gate driver GDR, and the like, can be disposed in the control printed circuit board CPCB.

In addition, a power management IC (PMIC) or the like can be disposed on the control printed circuit board CPCB. The power management IC supplies various forms of voltage or current to the panel PNL, the data driver DDR, the gate driver GDR, and the like, or controls various forms of voltage or current to be supplied to the same.

The source printed circuit board SPCB and the control printed circuit board CPCB can be circuitry-connected to each other via at least one connector CBL. The connector CBL can be, for example, a flexible printed circuit (FPC), a flexible flat cable (FFC), or the like.

The at least one source printed circuit board SPCB and the control printed circuit board CPCB can be integrated (or combined) into a single printed circuit board.

In a situation in which the gate driver GDR is implemented using a GIP structure, a plurality of gate driver circuits GDC of the gate driver GDR can be directly disposed in the non-active area N/A of the panel PNL.

Each of the plurality of gate driver circuits GDC can output a scanning signal SCAN to a corresponding gate line GL among the plurality of gate lines GL disposed in the active area A/A of the panel PNL.

The plurality of gate driver circuits GDC disposed on the panel PNL can be supplied with a variety of signals (e.g., a clock signal, a high-level gate voltage VGH, a low-level gate voltage VGL, a start signal VST, a reset signal RST, and the like), for the generation of the scanning signal, via the gate driving-related lines disposed in the non-active area N/A.

The gate driving-related lines disposed in the non-active area N/A can be electrically connected to certain source-side circuit films SF disposed closest to the plurality of gate driver circuits GDC.

Figure 3:
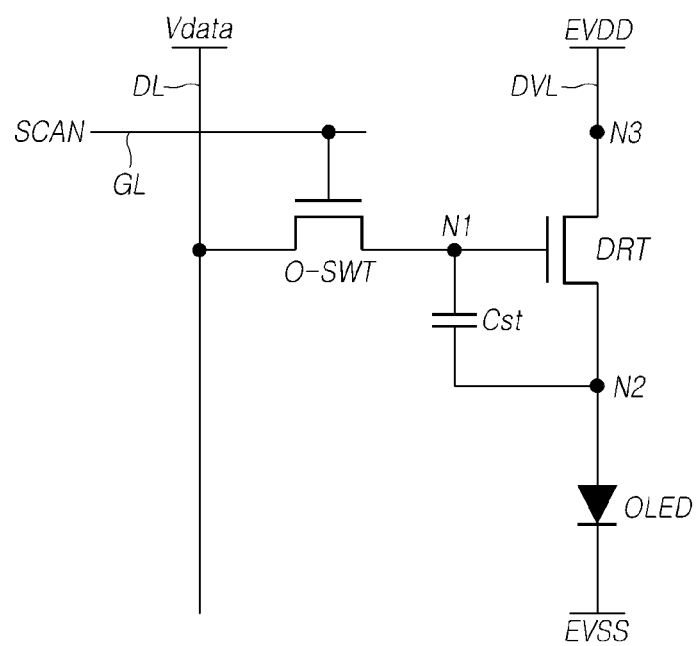
FIG. 3 illustrates a structure of a subpixel in the panel according to embodiments in a situation in which the panel is an organic light-emitting diode (OLED) panel.

FIG. 3 illustrates a structure of a subpixel SP in the panel PNL according to embodiments in a situation in which the panel PNL is an OLED panel.

Referring to FIG. 3, each of the subpixels SP in the OLED panel PNL can include an organic light-emitting diode OLED, a driving transistor DRT driving the organic light-emitting diode OLED, a switching transistor O-SWT electrically connected between a first node N1 of the driving transistor DRT and a corresponding data line DL, a storage capacitor Cst electrically connected to a first node and a second node N2 of the driving transistor DRT, and the like.

The organic light-emitting diode OLED can include an anode, an organic light-emitting layer, a cathode, and the like.

Referring to the circuit in FIG. 3, the anode (also referred to as a pixel electrode) of the organic light-emitting diode OLED may be electrically connected to the second node N2 of the driving transistor DRT. The cathode (also referred to as a common electrode) of the organic light-emitting diode OLED can have a base voltage EVSS applied thereto.

Herein, the base voltage EVSS can be, for example, a ground voltage or a voltage higher or lower than the ground voltage. In addition, the base voltage EVSS can vary, depending on the driving state. For example, the base voltage EVSS, during image driving, and the base voltage EVSS, during sensing driving can be set differently.

The driving transistor DRT drives the organic light-emitting diode OLED by supplying a driving current to the organic light-emitting diode OLED.

The driving transistor DRT can include the first node N1, the second node N2, a third node N3, and the like.

The first node N1 of the driving transistor DRT can be a gate node, and can be electrically connected to a source node or a drain node of the switching transistor O-SWT. The second node N2 of the driving transistor DRT can be a source node or a drain node, and can be electrically connected to an anode (or a cathode) of the organic light-emitting diode OLED. The third node N3 of the driving transistor DRT can be a drain node or a source node, to which a driving voltage EVDD can be applied. The third node N3 can be electrically connected to a driving voltage line DVL, through which the driving voltage EVDD is supplied.

The storage capacitor Cst can be electrically connected between the first node N1 and the second node N2 of the driving transistor DRT to maintain a data voltage Vdata corresponding to an image signal voltage or a voltage corresponding to the data voltage Vdata during a single frame time (or a predetermined time).

The drain node or source node of the switching transistor O-SWT can be electrically connected to a corresponding data line DL. The source node or drain node of the switching transistor O-SWT can be electrically connected to the first node N1 of the driving transistor DRT. The gate node of the switching transistor O-SWT can be electrically connected to a corresponding gate line GL, through which a scanning signal SCAN is applied thereto.

The scanning signal SCAN can be applied to the gate node of the switching transistor O-SWT via the corresponding gate line, so that the switching transistor O-SWT is on-off controlled.

The switching transistor O-SWT can be turned on by the scanning signal SCAN to transfer the data voltage Vdata, supplied from the corresponding data line DL, to the first node of the driving transistor DRT.

In addition, the storage capacitor Cst can be an external capacitor intentionally designed to be disposed externally of the driving transistor DRT, rather than a parasitic capacitor (e.g., Cgs or Cgd), e.g., an internal capacitor present between the first node N1 and the second node N2 of the driving transistor DRT.

Each of the driving transistor DRT and the switching transistor O-SWT can be an n-type transistor or a p-type transistor.

The subpixel structure illustrated in FIG. 3 has a two transistors and one capacitor (2T1C) structure. However, this is presented for illustrative purposes only, and in some situations, one or more transistors or one or more capacitors can further be included. In addition, the plurality of subpixels can have the same structure, or some subpixels among the plurality of subpixels can have a different structure from that of the remaining subpixels.

Figure 4:
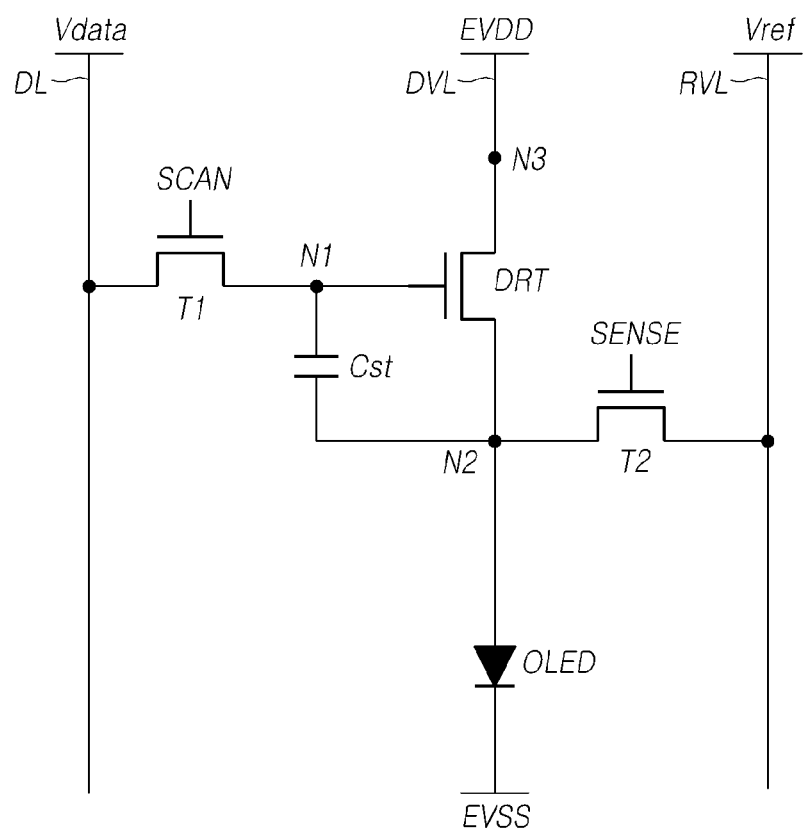
FIG. 4 illustrates a three transistors and one capacitor (3T1C) structure of a single subpixel further including a second transistor electrically connected between the second node of the driving transistor and the reference voltage line according to an embodiment.

FIG. 4 illustrates a three transistors and one capacitor (3T1C) structure of a subpixel SP. The 3T1C structure further includes a second transistor T2 electrically connected to the second node N2 of the driving transistor DRT and a reference voltage line RVL.

Referring to FIG. 4, the second transistor T2 can be electrically connected between the second node N2 of the driving transistor DRT and the reference voltage line RVL. A second scanning signal SCAN2 can be applied to a gate node of the second transistor T2 to on-off control the second transistor T2.

A drain node or a source node of the second transistor T2 can be electrically connected to the reference voltage line RVL, and the source node or the drain node of the second transistor T2 can be electrically connected to the second node N2 of the driving transistor DRT.

For example, the second transistor T2 can be turned on in a period during display driving, and can be turned off in a period during sensing driving in which characteristics of the driving transistor DRT or characteristics of the organic light-emitting diode OLED are sensed.

The second transistor T2 can be turned on by the second scanning signal SCAN2 at a corresponding driving time (e.g., a display driving time or an initialization time in the period during sensing driving) to transfer a reference voltage Vref, supplied to the reference voltage line RVL, to the second node N2 of the driving transistor DRT.

In addition, the second transistor T2 can be turned on by the second scanning signal SCAN2 at a corresponding driving time (e.g., a sampling time in the period during sensing driving) to transfer a voltage of the second node N2 of the driving transistor DRT to the reference voltage line RVL.

In other words, the second transistor T2 can control the voltage state of the second node N2 of the driving transistor DRT or transfer a voltage of the second node N2 of the driving transistor DRT to the reference voltage line RVL.

The reference voltage line RVL can be electrically connected to the analog-to-digital converter (ADC) sensing and converting the voltage of the reference voltage line RVL to a digital value and outputting sensing data including the digital value.

The analog-to-digital converter can be included in the source driver ICs SDIC of the data driver DDR.

Detection data, output by the analog-to-digital converter, can be used to sense characteristics (e.g., a threshold voltage or mobility) of the driving transistor DRT or characteristics (e.g., a threshold voltage) of the organic light-emitting diode OLED.

In addition, the capacitor Cst can be an external capacitor intentionally designed to be disposed externally of the driving transistor DRT, rather than a parasitic capacitor (e.g., Cgs or Cgd), e.g., an internal capacitor present between the first node N1 and the second node N2 of the driving transistor DRT.

Each of the driving transistor DRT, a first transistor T1, and the second transistor T2 can be an n-type transistor or a p-type transistor.

In addition, a first scanning signal SCAN1 and the second scanning signal SCAN2 can be separate gate signals. In this situation, the first scanning signal SCAN1 and the second scanning signal SCAN2 can be applied to a gate node of the first transistor T1 and a gate node of the second transistor T2 through different gate lines, respectively.

In some situations, the first scanning signal SCAN1 and the second scanning signal SCAN2 can be the same gate signal. In this situation, the first scanning signal SCAN1 and the second scanning signal SCAN2 can be commonly applied to the gate node of the first transistor T1 and the gate node of the second transistor T2 through the same gate line.

The subpixel structures illustrated in FIGS. 3 and 4 are presented for illustrative purposes only, and in some situation, one or more transistors or one or more capacitors can further be included.

In addition, the plurality of subpixels can have the same structure, or some subpixels among the plurality of subpixels can have a different structure from the remaining subpixels.

Figure 5:
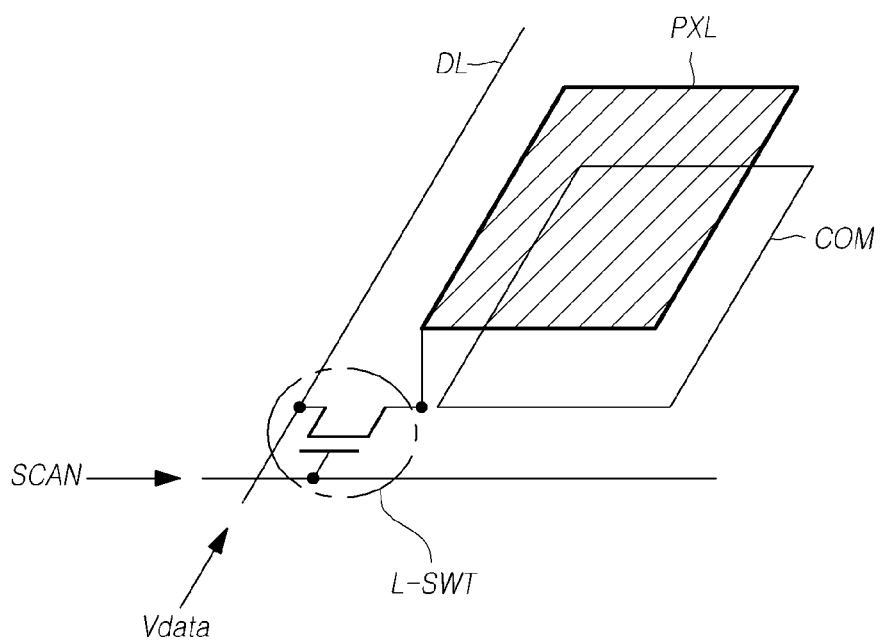
FIG. 5 illustrates a structure of a subpixel in the panel according to embodiments in a situation in which the panel is a liquid crystal display (LCD) panel.

FIG. 5 illustrates a structure of a subpixel SP in the panel PNL according to embodiments in a situation in which the panel PNL is an LCD panel.

Referring to FIG. 5, each of the subpixels SP in the LCD panel PNL can include a pixel electrode PXL and a switching transistor L-SWT.

The switching transistor L-SWT can be controlled by a scanning signal SCAN, and can be electrically connected between a corresponding data line DL and the pixel electrode PXL.

The switching transistor L-SWT is turned on by the scanning signal SCAN to transfer a data voltage Vdata, supplied from the data line DL, to the pixel electrode PXL. The pixel electrode PXL, to which the data voltage Vdata is applied, can form an electric field in concert with a common electrode COM, to which a common voltage is applied. That is, a capacitor (e.g., a storage capacitor) can be generated between the pixel electrode PXL and the common electrode COM.

Figure 6:
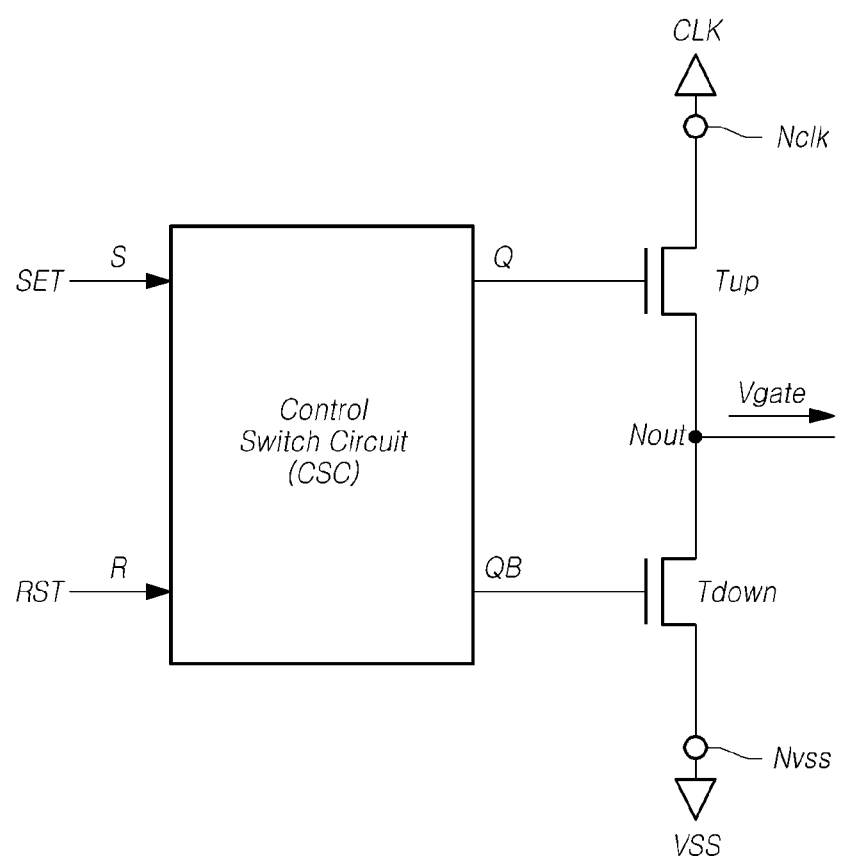
FIG. 6 schematically illustrates a gate driver circuit disposed in the panel according to embodiments.

FIG. 6 schematically illustrates a gate driver circuit GDC disposed in the panel PNL according to embodiments.

Referring to FIG. 6, each of the gate driver circuits GDC can include a pull-up transistor Tup, a pull-down transistor Tdown, a control switch circuit CSC, and the like.

The control switch circuit CSC is a circuit controlling a voltage of a node Q, corresponding to a gate node of the pull-up transistor Tup and a voltage of a node QB corresponding to a gate node of the pull-down transistor Tdown. The control switch circuit CSC can include a plurality of switches (transistors).

The pull-up transistor Tup is a transistor supplying a gate signal Vgate, corresponding to a first level voltage (e.g., a high-level voltage VGH), to the gate line GL through a gate signal output node Nout. The pull-down transistor Tdown is a transistor supplying a gate signal Vgate, corresponding to a second level voltage (e.g., a low-level voltage VGL), to the gate line GL through the gate signal output node Nout. The pull-up transistor Tup and the pull-down transistor Tdown can be turned on at different points in time.

The pull-up transistor Tup is electrically connected between a clock signal application node Nclk, to which a clock signal CLK is applied, and the gate signal output node Nout electrically connected to the gate line GL. The pull-up transistor Tup is turned on or off by the voltage of the node Q.

The gate node of the pull-up transistor Tup is electrically connected to the node Q. A drain node or a source node of the pull-up transistor Tup is electrically connected to the clock signal application node Nclk. The source node or the drain node of the pull-up transistor Tup is electrically connected to the gate signal output node Nout, from which the gate signal Vgate is output.

The pull-up transistor Tup is turned on by the voltage of the node Q to output the gate signal, having a high-voltage level VGH in a high-level range of the clock signal CLK, to the gate signal output node Nout.

The gate signal Vgate of the high-level voltage VGH, output to the gate signal output node Nout, is supplied to the corresponding gate line GL.

The pull-down transistor Tdown is electrically connected between the gate signal output node Nout and a base voltage node Nvss, and is turned on or off by the voltage of the node QB.

The gate node of the pull-down transistor Tdown is electrically connected to the node QB. A drain node or a source node of the pull-down transistor Tdown is electrically connected to the base voltage node Nvss to receive a base voltage VSS, corresponding to a positive voltage, applied thereto. The source node or the drain node of the pull-down transistor Tdown is electrically connected to the gate signal output node Nout, from which the gate signal Vgate is output.

The pull-down transistor Tdown is turned on by the voltage of the node QB to output the gate signal Vgate having a low-level voltage VGL to the gate signal output node Nout. Accordingly, the gate signal Vgate having the low-level voltage VGL can be supplied to the corresponding gate line GL through the gate signal output node Nout. Herein, the gate signal Vgate having the low-level voltage VGL can be, for example, a base voltage VSS.

In addition, the control switch circuit CSC can be comprised of two or more transistors, and can include major nodes, such as the node Q, the node QB, a set node (also referred to as a "start node") S, and a reset node R. In some situations, the control switch circuit CSC can further include an input node, to which a variety of voltages, such as a driving voltage VDD, is input.

In the control switch circuit CSC, the node Q is electrically connected to the gate node of the pull-up transistor Tup, and is repeatedly charged and discharged.

In the control switch circuit CSC, the node QB is electrically connected to the gate node of the pull-down transistor Tdown, and is repeatedly charged and discharged.

In the control switch circuit CSC, the set node S has a set signal SET applied thereto, the set signal SET indicating the start of gate driving of the corresponding gate driver circuit GDC.

Herein, the set signal SET applied to the set node S can be a start signal VST input from outside of the gate driver GDR, or can be a signal (e.g., a carry signal), to which a gate signal Vgate, output by a gate driver circuit GDC in a previous stage, preceding the current gate driver circuit GDC, is feedbacked.

The reset signal RST, applied to the reset node R of the control switch circuit CSC, can be a reset signal, by which the gate driver circuits GDC of all stages are simultaneously initialized, or can be a carry signal input from another stage (e.g., a previous or subsequent stage).

The control switch circuit CSC charges the node Q in response to the set signal SET, and discharges the node Q in response to the reset signal RST. The control switch circuit CSC can include an inverter circuit to charge or discharge the node Q and the node QB at different points in time.

As illustrated in FIG. 3, the driving transistor DRT and the switching transistor O-SWT can be disposed in each subpixel SP among the plurality of subpixels SP in the active area A/A of the panel PNL implemented as an OLED panel. However, embodiments are not limited thereto, and as illustrated in FIG. 4, three or more transistors can be disposed in the active area A/A of the OLED panel PNL.

In addition, as illustrated in FIG. 5, a switching transistor L-SWT can be disposed in each subpixel SP among the plurality of subpixels SP in the active area A/A of the OLED panel PNL.

As described above, at least one of the transistor DRT, O-SWT, or L-SWT can be disposed in each area of the plurality of subpixels SP in the active area A/A of the OLED panel PNL.

In addition, as illustrated in FIG. 2, the gate driver circuit GDC can be implemented using an INS1P structure, e.g., the gate driver circuit GDC can be disposed within the panel PNL. In this situation, a variety of transistors of the gate driver circuit GDC, such as the pull-up transistor Tup, the pull-down transistor Tdown, and other transistors within the CSC, as illustrated in FIG. 5, can be disposed in the non-active area N/A, located in the periphery of the active area A/A of the panel PNL.

In addition, in the transistors TR disposed in the active area A/A and/or the non-active area N/A of the panel PNL, the device performance (e.g., mobility or on-current characteristic) thereof can be determined by the channel length and S-factor (SS, sub-threshold swing). Therefore, the structure of a transistor TR, among the transistors TR, having a short channel and a high S-factor to improve device performance will be described hereinafter.

The transistor TR according to example embodiments can include: a first electrode disposed on a substrate; an insulation pattern disposed on the substrate and overlapping one end of the first electrode; a second electrode disposed on a portion of a top surface of the insulation pattern; an active layer disposed on the first electrode, the insulation pattern, and the second electrode; a gate insulating film disposed on the active layer; and a gate electrode disposed on the gate insulating film. One end of the active layer overlaps the first electrode, the other end of the active layer overlaps the second electrode, and a channel area is provided in a portion of the active layer that does not overlap either the first electrode or the second electrode. The channel area of the active layer includes an area corresponding to a side surface of the insulation pattern and an area in which the active layer overlaps a portion of the top surface of the insulation pattern that does not overlap the second electrode. The thickness of a portion of the gate insulating film, in the area corresponding to the side surface of the insulation pattern, may be lower than the thickness of a portion of the gate insulating film, in the area overlapping the portion of the top surface of the insulation pattern that does not overlap the second electrode.

The structure of the transistor TR, as briefly described above, will be described in more detail with reference to the accompanying drawings.

Figure 7:
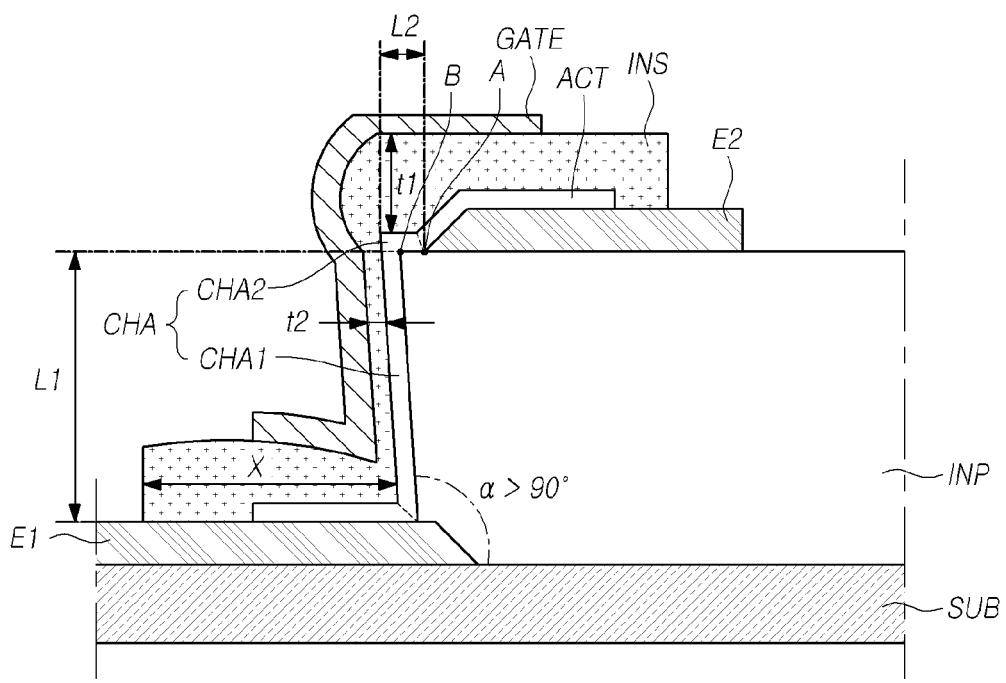
FIG. 7 illustrates a transistor having a vertical structure according to an embodiment.
Figure 8:
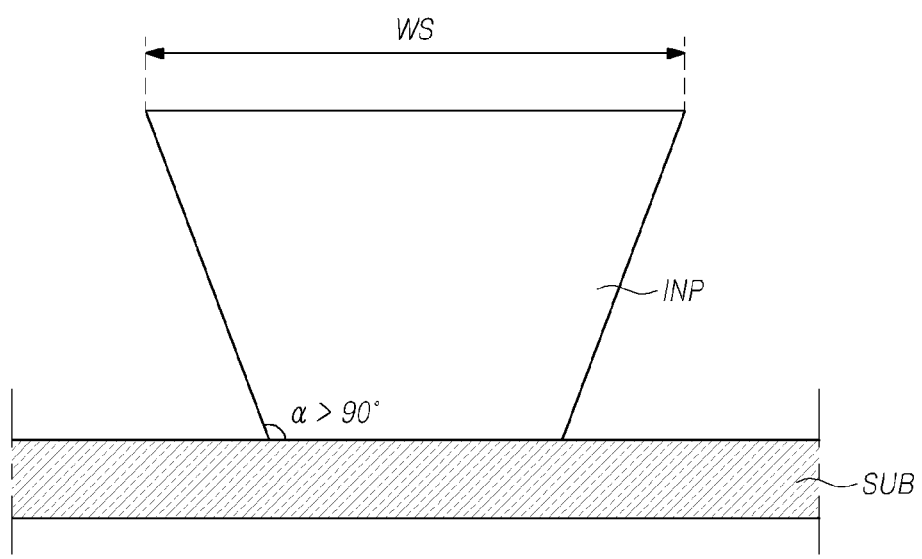
FIG. 8 illustrates a shape of the insulation pattern according to an embodiment.

FIG. 7 illustrates a transistor having a vertical structure according to an embodiment, while FIG. 8 illustrates a shape of the insulation pattern according to an embodiment.

The transistor TR having a vertical structure, defined according to embodiments, is a transistor TR in which a channel area CHA of an active layer ACT is disposed to be non-parallel to a substrate SUB. Collectively, all situations in which the angle between the channel area CHA and the substrate SUB of the active layer ACT is greater than 0° and smaller than 180° can be taken.

Referring to FIG. 7, the transistor TR having a vertical structure, disposed in the panel PNL, can include a gate electrode GATE, an active layer ACT, a first electrode E1, and a second electrode E2.

The first electrode E1 can be a source electrode, while the second electrode E2 can be a drain electrode. Alternatively, the first electrode E1 can be the drain electrode, while the second electrode E2 can be the source electrode.

Specifically, the first electrode E1 is disposed on the substrate SUB.

An insulation pattern INP is disposed on the substrate SUB, on which the first electrode E1 is disposed, the insulation pattern INP overlaps one end of the first electrode E1.

In the transistor TR having a vertical structure, the insulation pattern INP can be a structure, in which a portion of the channel area CHA of the active layer ACT extends vertically, in a direction non-parallel to the substrate SUB. The insulation pattern INP can contain an inorganic insulating material, for example, at least one of $SiOx$, $SiO_2$, $SiON$, $SiNx$, or the like.

The second electrode E2 is disposed on a portion of the top surface of the insulation pattern INP.

In addition, as illustrated in FIG. 7, one end A of the second electrode E2 is spaced apart from one end B of the insulation pattern INP.

The active layer ACT is disposed on a portion of the first electrode E1, a portion (or the entirety) of the second electrode E2, and one side surface of the insulation pattern INP in an overlapping manner.

Specifically, as illustrated in FIG. 7, one end of the active layer ACT can overlap the first electrode E1, and the other end of the active layer ACT can overlap the second electrode E2.

Although the active layer ACT is illustrated as being a single layer in FIG. 7, the present disclosure is not limited thereto. Rather, the active layer ACT can be comprised of two or more layers.

The active layer ACT can include the channel area CHA.

The channel area CHA can include an area corresponding to one side surface of the insulation pattern INP and an area overlapping a portion of the top surface of the insulation pattern INP that does not overlap the second electrode E2 (e.g., the channel area CHA can go around a corner or stepped portion of the insulation pattern INP, the channel area CHA of the active layer ACT can contact two different surfaces of the insulation pattern INP).

That is, the active layer ACT can be an area in which the channel area CHA does not overlap either the first electrode E1 or the second electrode E2. The channel area CHA can vertically and/or horizontally overlap with the gate electrode GATE in the cross-section view.

According to another aspect, the channel area CHA of the active layer ACT can correspond to a first portion CHA1, e.g., an area overlapping one side surface of the insulation pattern INP, and a second portion CHA2, e.g., an area extending from the first portion CHA1, the second portion CHA2 can be disposed on an exposed upper surface of the insulation pattern INP. In the second portion CHA2, one end A of the second electrode E2 and one end B of the insulation pattern INP are spaced apart from each other so that an upper portion of the insulation pattern INP is exposed by the second electrode E2.

Thus, the length of the channel area CHA can be a sum of the length L1 of the first portion CHA1 and the length L2 of the second portion CHA2.

In other words, the length of the channel area CHA can be a sum of the length L1 of the active layer ACT located on one side surface of the insulation pattern INP and the length L2 of the active layer ACT extending from the active layer ACT. The active layer ACT is located on one side surface of the insulation pattern INP while being disposed in the area overlapping a portion of the top surface of the insulation pattern INP that does not overlap the second electrode E2.

As described above, L1 indicates the length of the active layer ACT in the area overlapping one side surface of the insulation pattern INP.

Since the length of the channel area CHA of the active layer ACT according to an embodiment includes the length of the active layer ACT in the area overlapping one side surface of the insulation pattern INP, the length of the channel area CHA can be changed with a change in the height of the insulation pattern INP. That is, the length of the channel area CHA can be proportional to the height of the insulation pattern INP. In other words, the length of the channel area CHA can be adjusted or finely tuned by changing the height of the insulation pattern INP.

For example, when the height of the insulation pattern INP is reduced, the length of the active layer ACT is reduced in the area overlapping one side surface of the insulation pattern INP (e.g., CHA1 is reduced), thereby reducing the entire length of the channel area CHA.

In other words, in the transistor TR according to embodiments, it is possible to adjust the length of the channel area CHA by merely adjusting the height of the insulation pattern INP, instead of determining the length of the channel area CHA of the active layer ACT by exposure processing or the like.

Although the height of the insulation pattern INP according to an embodiment can range from 100 nm to 500 nm, the present disclosure is not limited thereto.

In the situation of a transistor having a horizontal structure, exposure processing is applied to microscopic sizes to reduce the length of the channel area CHA of the active layer ACT. However, it may be difficult to sufficiently reduce the length of the channel area CHA, due to the limited ability of exposure equipment (e.g., in other words, the ability of using a mask or other exposure techniques to control the sizing of a very small channel area can become limited or become less effective, production yields can become lower as transistors become smaller and smaller—and the channel area becomes harder to control).

In addition, even in the situation that the active layer ACT having a short channel is formed using exposure equipment, the channel areas CHA of the transistors TR, fabricated in the panel PNL, have non-uniform lengths. The lengths of the channel areas CHA may vary depending on the transistor TR.

However, the transistor TR according to example embodiments does not need to rely solely on exposure processing to fabricate an active layer ACT with a short channel, since the length of the channel area of the active layer ACT is adjustable using the height of the insulation pattern INP.

A gate insulating film INS is disposed to cover the active layer ACT. The gate insulating film INS can be disposed to cover the top surface and a side surface of the active layer ACT while covering a portion of the first electrode E1 and a portion or the entirety of the second electrode E2. For example, as shown in FIG. 7, the gate insulating film INS can overlap with the channel area in a vertical direction relative to the substrate.

The gate electrode GATE is disposed on the gate insulating film INS.

The transistor TR having the above-described structure is applicable to the driving transistor DRT among the plurality of transistors TR disposed in the OLED panel PNL.

The driving transistor DRT has a high S-factor and a high on-current characteristic. The term "on-current" means current when the panel is turned on. In particular, the above-described characteristic may be more important for the driving transistor DRT used in the OLED panel PNL for mobile applications.

The S-factor may be represented using a sub-threshold graph, e.g., an S-factor graph.

The S-factor graph is a graph representing the ratio of the variation of gate voltage to the variation of driving current. A relatively-high inclination of the S-factor graph of the driving transistor DRT may lead to a narrow range of available data voltages, which is disadvantageous for low-gradation expression. In this situation, the transistor may be converted from an off state to an on state at a low rate.

Here, the inclination of the S-factor graph may be 1/S-factor.

In other words, the S-factor indicates how fast channel potential changes in response to a change in the gate voltage. A high S-factor means a relatively-slow change in channel potential, compared to the situation of a low S-factor.

The S-factor relates to a capacitance value of the gate insulating film INS. Specifically, the capacitance value of the gate insulating film INS is inversely proportional to the S-factor.

Herein, the capacitance value of the gate insulating film INS means a capacitance value per area, generated by the gate electrode GATE and the channel area CHA. The relationship among the capacitance value of the gate insulating film INS, the thickness of the gate insulating film INS, and the dielectric constant of the gate insulating film INS can be expressed by Formula 1:

$$C_{INS} \propto \frac{\varepsilon_{INS}}{T_{INS}} \qquad [\text{Formula 1}]$$

In Formula 1, $C_{INS}$ is the capacitance value of the gate insulating film INS, $T_{INS}$ is the thickness of the gate insulating film INS, and $\varepsilon_{INS}$ is the dielectric constant of the gate insulating film INS.

According to Formula 1, it can be appreciated that the capacitance value of the gate insulating film INS, located between the channel area CHA and the gate electrode GATE, is inversely proportional to the thickness of the gate insulating film INS. In addition, the S-factor can increase with increases in the thickness of the gate insulating film INS.

That is, when the thickness of the gate insulating film INS is relatively high, the gate voltage can arrive at the channel area CHA more slowly, compared to when the thickness of the gate insulating film INS is relatively low. Accordingly, the S-factor can be increased.

As described above, the S-factor can be adjusted by adjustment of the thickness of the gate insulating film in the area overlapping the gate electrode GATE.

In a typical transistor having a planar structure, when the thickness of the gate insulating film is reduced, a greater on-current may be obtained, while the S-factor may be lowered. In contrast, when the thickness of the gate insulating film is increased, a higher S-factor may be obtained, while the on-current may be reduced.

In addition, the magnitude of the on-current may be adjusted by changing not only the thickness of the gate insulating film, but also the channel length of the active layer. Specifically, with reductions in the channel length of the active layer, the threshold voltage may be lowered, thereby increasing the on-current.

Accordingly, research has been undertaken on typical transistors having a planar structure to realize a high S-factor and high on-current properties using the short channel of the active layer while maintaining the thickness of the gate insulating film. However, as described above, it has been difficult to fabricate an active layer with a short channel, due to process limits.

In the electronic device, according to an embodiment, includes, the active layer ACT with a short channel area CHA, due to the use of the driving transistor DRT as the transistor TR having a vertical structure, and the thickness of the gate insulating film INS is adjusted, depending on the area. Accordingly, a high S-factor and a high on-current characteristic can be obtained.

In the transistor TR having a vertical structure according to an embodiment, the channel area CHA of the active layer ACT can be defined by lowering the height of the insulation pattern INP. Although the height of the insulation pattern INP can range from 100 nm to 500 nm, the present disclosure is not limited thereto.

That is, it is possible to easily realize an active layer ACT having a short channel, which has not been realized in the transistor having a horizontal structure, due to processing problems or the like.

In addition, in the electronic device according to an embodiment, it is possible to increase the S-factor by increasing the thickness of a portion of the gate insulating film INS.

Specifically, the thickness (hereinafter, referred to as "first thickness") t1 of the gate insulating film INS disposed on the active layer ACT disposed in an area corresponding to the area, in which one end of the second electrode E2 and one end of the insulation pattern INP are spaced apart from each other, can be thicker than the thickness (hereinafter, referred to as "second thickness") t2 of the gate insulating film INS disposed on the active layer ACT in the area overlapping one side surface of the insulation pattern INP.

That is, in the gate insulating film INS disposed on the channel area CHA of the active layer ACT, the first thickness t1 of the gate insulating film INS can be thicker than the second thickness t2 of the gate insulating film INS. The first thickness t1 is a thickness of the gate insulating film INS in a direction non-parallel to the substrate SUB, while the second thickness t2 is a thickness of the gate insulating film INS in a direction parallel to the substrate SUB.

Since the first thickness t1 is thicker than the second thickness t2, the resistance of a portion of the channel area CHA, corresponding to the area in which the gate insulating film INS has the first thickness, can be greater than the resistance of a portion of the channel area CHA, corresponding to the area in which the gate insulating film INS has the second thickness T2.

Accordingly, since the first thickness t1 is thicker than the second thickness t2, channel potential of the portion corresponding to the area in which the gate insulating film INS has the first thickness t1 can change more slowly than channel potential of the portion corresponding to the area in which the gate insulating film INS has the second thickness t2.

Even in the situation that the channel potential of some portion of the channel area CHA may rapidly change, if the channel potential of the remaining portion of the channel area CHA changes slowly, the potential of the entirety of the channel area CHA can be dependent of the speed of the portion of the channel area CHA in which the potential changes most slowly (e.g., the second portion CHA2 that overlaps with the portion of the gate insulating film INS having the first thickness t1).

That is, the effect of increasing the S-factor can be obtained by merely increasing the thickness of a specific area of the gate insulating film INS disposed on the channel area CHA.

In other words, the transistor TR having a vertical structure according to an embodiment can have a high on-current characteristic, since the active layer ACT has a short channel. The S-factor can be increased by adjusting the thickness of the gate insulating film INS, disposed in the channel area CHA, such that the thickness of a portion of the gate insulating film INS is increased. Accordingly, the effect of increasing the range of available data voltages can be obtained.

In addition, the short channel of the active layer ACT can increase the driving current of the transistor TR having a vertical structure.

In addition, as illustrated in FIGS. 7 and 8, the gate insulating film INS can include an area in which the width WS of the insulation pattern INP increases in a direction away from the substrate SUB. This area of the gate insulating film INS, corresponding to a portion of the side surface of the insulation pattern INP, has the second thickness t2, e.g., a thinner thickness.

Specifically, an angle α between one surface of the insulation pattern INP and the substrate SUB can be greater than 90°. That is, the insulation pattern INP can have a reverse tapered shape. Herein, the width WS of the insulation pattern INP can be a length taken in a direction parallel to the substrate SUB.

According to the present disclosure, the gate insulating film INS can be fabricated by a deposition process.

However, since the insulation pattern INP has a reverse tapered shape, a raw material of the gate insulating film INS is blocked by a distal end of the upper portion of the insulation pattern INP, so that a suitable amount of the raw material fails to arrive at the side surface of the insulation pattern INP. Accordingly, the thickness of the gate insulating film INS, formed on one side surface of the insulation pattern INP, can be thinner than the thickness of the gate insulating film INS formed on the top surface of the insulation pattern INP and on the first electrode E1.

The transistors TR according to example embodiments can have device areas smaller than those of typical transistors having a horizontal structure. Specifically, in the transistor TR according to embodiments, a portion of the active layer ACT extends vertically, in a direction non-parallel to the substrate SUB, due to the insulation pattern INP. Accordingly, the channel area CHA, as well as the length of the active layer ACT, can be reduced, thereby reducing the device area.

In addition, the active layer ACT is configured to directly contact the first electrode E1 and the second electrode E2.

When a gate insulating film is disposed between the active layer ACT and the first electrode E1 and between the active layer ACT and the second electrode E2, the first electrode E1 and the second electrode E2 can respectively contact the active layer ACT via contact holes formed in the gate insulating film. In this situation, the area of the first electrode E1 and the area of the second electrode E2 can inevitably be increased by areas corresponding to the widths of entrances of the contact holes formed in the gate insulating film. In contrast, in the transistor TR according to an embodiment, the device area can be reduced, since the active layer ACT is in direct contact with the first electrode E1 and the second electrode E2 as described above.

Although the gate insulating film INS disposed between the active layer ACT and the gate electrode GATE is illustrated as being a single layer in FIG. 7, the present disclosure is not limited thereto. Rather, the gate insulating film INS may be comprised of two or more layers. This configuration will be described hereinafter with reference to FIG. 9.

Figure 9:
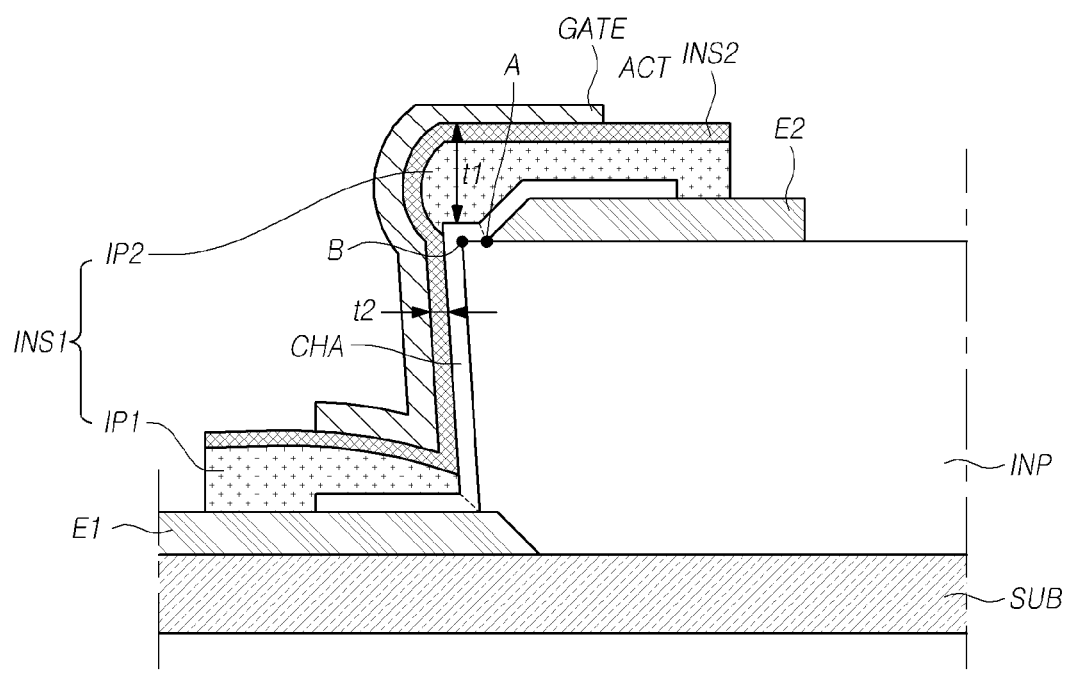
FIG. 9 illustrates a transistor having a vertical structure according to another embodiment.

FIG. 9 illustrates a transistor having a vertical structure according to another embodiment.

In the following, descriptions of some features (e.g., components or effects) will be omitted when they are identical to those of the above-described embodiments.

Referring to FIG. 9, the transistor TR having a vertical structure according to another embodiment can include a gate electrode GATE, an active layer ACT, a first electrode E1, and a second electrode E2.

An insulation pattern INP is disposed on the substrate SUB, on which the first electrode E1 is disposed, to overlap one end of the first electrode E1.

Since the insulation pattern INP is disposed to overlap with one end of the first electrode E1, the length of a channel area CHA of the active layer ACT can be further reduced.

Specifically, the relationship of the length of the channel area CHA to the arrangement structure of the first electrode E1 and the insulation pattern INP will hereinafter be discussed with reference to FIG. 10.

Figure 10:
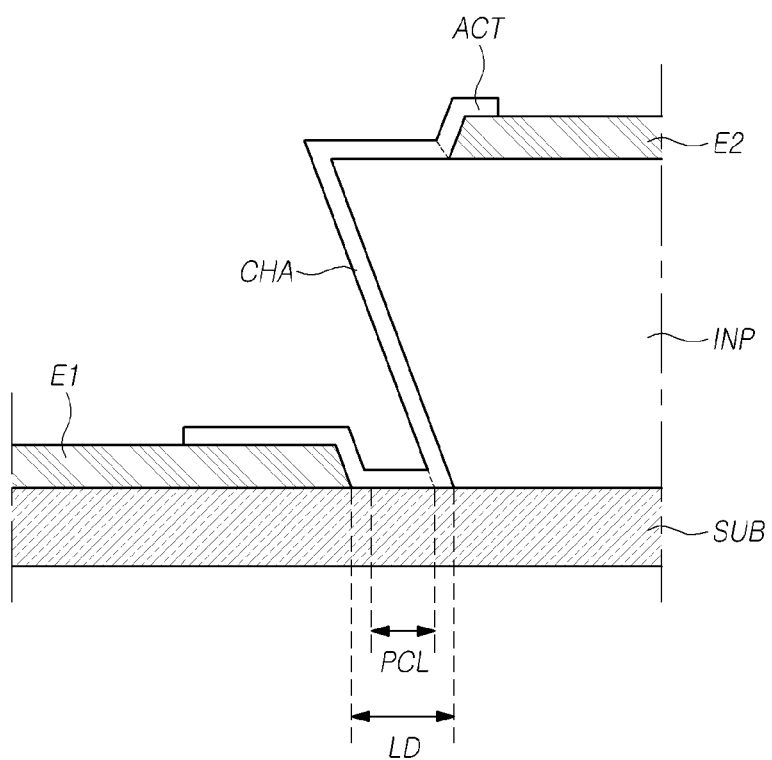
FIG. 10 illustrates the relationship of the length of the channel area to the arrangement structure of the first electrode and the insulation pattern according to an embodiment.

FIG. 10 illustrates the relationship of the length of the channel area to the arrangement structure of the first electrode and the insulation pattern INP.

Referring to FIG. 10, the first electrode E1 and the insulation pattern INP can be spaced apart from each other. One end of the active layer ACT can overlap the first electrode E1, while the other end of the active layer ACT can overlap the second electrode E2.

The channel area CHA of the active layer ACT can be provided along one side surface and a portion of the top surface of the insulation pattern INP. The channel area CHA can also be provided on a portion of the substrate SUB, located between the first electrode E1 and the insulation pattern INP.

Thus, the length of the channel area CHA of the active layer ACT illustrated in FIG. 10 can be longer than the length of the channel area CHA illustrated in FIGS. 7 and 9, by an amount equal to the length PCL of the channel area CHA disposed on the portion of the substrate SUB between the first electrode E1 and the insulation pattern INP.

The length PCL of the channel area CHA, disposed on the portion of the substrate SUB between the first electrode E1 and the insulation pattern INP, may be shorter than a distance LD between the first electrode E1 and the insulation pattern INP.

That is, the transistor TR having a vertical structure according to embodiments can realize a relatively short channel, due to the insulation pattern INP overlapping one end of the first electrode E1.

In FIG. 9, one end of the active layer ACT is disposed along a portion of the top surface of the first electrode E1, one side surface of the insulation pattern INP, a portion of the top surface of the insulation pattern INP, and a portion of the top surface of the second electrode E2.

A first gate insulating film INS1 and a second gate insulating film INS2 are disposed on the active layer ACT.

The first gate insulating film INS includes a first area IP1 overlapping the first electrode E1 and a second area IP2 overlapping the second electrode E2.

The first gate insulating film INS1 is disposed to expose the top surface of the active layer ACT disposed in an area corresponding to a portion of a side surface of the insulation pattern INP. An area of the active layer ACT, the top surface of which is partially exposed by the first gate insulating film INS1, can be a portion of the channel area CHA.

The second area IP2 can also be disposed in an area in which one end A of the second electrode E2 and one end B of the insulation pattern INP are spaced apart, such that the second electrode E2 exposes the top surface of the insulation pattern INP.

The channel area CHA of the active layer ACT can be provided on an area in which one end A of the second electrode E2 and one end B of the insulation pattern INP are spaced apart, such that the second electrode E2 exposes the top surface of the insulation pattern INP.

That is, the second area IP2 can also be disposed on a portion of the channel area CHA, for example, a second portion CHA2 of the channel area CHA.

The second gate insulating film INS2 can be disposed on the first gate insulating film INS1 and the active layer ACT.

The second gate insulating film INS can be disposed to cover the first gate insulating film INS and the active layer ACT.

Although the structure, in which ends of the first gate insulating film INS1 and the second gate insulating film INS2 overlap the first electrode E1 and the second electrode E2, is illustrated in FIG. 9, the present disclosure is not limited thereto. For example, the first gate insulating film INS1 can be disposed on the front surface (or top surface) of the substrate SUB, except for on a portion corresponding to a side surface of the insulation pattern INP, and the second gate insulating film can be disposed on the front surface of the substrate SUB. Alternatively, some portions of the first insulating film INS1 can be disposed between the second gate insulating film INS2 and a side surface of the insulation pattern INP (e.g., due to manufacturing deviations or processing constraints).

In the transistor TR having a vertical structure according to embodiments, the insulation pattern INP causes a portion of the channel area CHA of the active layer ACT to extend vertically, in a direction non-parallel to the substrate SUB.

However, it may be difficult to obtain thickness reliability from some components, among the components disposed on the insulation pattern INP, such as the active layer ACT or the second gate insulating film INS2, fabricated along the insulation pattern INP and having small-thickness requirement.

To overcome such problems, the active layer ACT and the second gate insulating film INS2 in the electronic device according to embodiments can be fabricated by a thin-film deposition method, such as metal-organic chemical vapor deposition (MOCVD) or atomic layer deposition (ALD), in which thin-film deposition processing is controllable.

The MOCVD method is a subclass of chemical vapor deposition (CVD), used to fabricate a thin film by a deposition reaction on the surface of a hot substrate onto which reactant gases are injected. The reactant gases contain an organometallic complex. The MOCVD method is a technique of growing a semiconductor thin film by decomposing organometallic gases on the hot substrate by heat. The MOCVD method is performed at a lower temperature than other CVD methods, such as plasma enhanced chemical vapor deposition (PECVD) and low-pressure chemical vapor deposition (LPCVD). Thin film processing can be controlled at the atomic level, so that a uniform thin film can be fabricated.

The ALD method is a subclass of CVD, used to fabricate a thin film by separately supplying reactants and depositing particles, produced by chemical reaction of reactant gases, on the surface of a substrate. After chemical adsorption of one reactant to the substrate, a second gas or a third gas is supplied to the substrate, causing subsequent chemical adsorption to the substrate, so that a thin film is deposited on the substrate.

The use of the MOCVD or ALD method can improve the productivity or growth rate of a thin film, compared physical vapor deposition (PVD) methods or other CVD methods. In addition, due to high thin film coating performance, the thickness of the thin film can be more precisely adjusted. That is, the use of the MOCVD or ALD method can fabricate a thin film having excellent step-coverage properties.

In addition, the MOCVD or ALD method can fabricate a thin film having a higher thickness and composition uniformity, as well as a higher level of density, compared to other deposition methods, such as sputtering.

The active layer ACT and the second gate insulating film INS2, fabricated by the MOCVD or ALD method, can be very thin films fabricated without a break, e.g., a discontinuity in an electrical circuit, even in a stepped area.

In addition, the active layer ACT and the second gate insulating film INS2, fabricated by the MOCVD or ALD method, can have a very small position-specific variation in thickness. That is, the active layer ACT and the second gate insulating film INS2 can have very high thickness uniformity.

In contrast, the first gate insulating film INS1, including the first area IP1 and the second area IP2, can be fabricated by deposition methods other than the MOCVD or ALD method. For example, the first gate insulating film INS1 can be fabricated by another deposition method, such as PECVD or sputtering.

In the process of fabricating the first gate insulating film INS1, a raw material of the first gate insulating film INS1 can be blocked by one end of the upper portion of the insulation pattern INP having a reverse tapered shape, thereby failing to reach the area corresponding to a side surface of the insulation pattern INP. Accordingly, the first gate insulating film INS1 can be created in the areas corresponding to the top surfaces of the first electrode E1 and the insulation pattern INP, while not being depositing on the area corresponding to the side surface of the insulation pattern INP.

In addition, the second gate insulating film INS2 can be disposed to overlap the first gate insulating film INS1 and the active layer ACT while having a smaller thickness variation and a higher level of density, compared to the first gate insulating film INS1.

In addition, the second gate insulating film INS2 can be thinner than the first gate insulating film INS1. Specifically, the thickest area of the second gate insulating film INS2 can be thinner than the thickest area of the first gate insulating film INS1.

For example, the thickness of the second gate insulating film INS2 be equal to or less than 50 nm, while the thickness of the first gate insulating film INS1 can be greater than 50 nm and equal to or less than 200 nm.

Thus, the gate insulating films, disposed between the channel area CHA and the gate electrode GATE of the active layer ACT, can have thickness variations, depending on the position.

Specifically, in the area in which one end A of the second electrode E2 and one end B of the insulation pattern INP are spaced apart from each other, such that the second electrode E2 exposes the top surface of the insulation pattern INP, the first gate insulating film INS1 and the second gate insulating film INS2 are disposed between the channel area CHA and the gate electrode GATE. In the area in which the active layer ACT overlaps one side surface of the insulation pattern INP, the second gate insulating film INS2 is disposed between the channel area CHA and the gate electrode GATE.

That is, the thickness t1 of the gate insulating films (e.g., the first and second gate insulating films), provided on the channel area CHA present on the top surface of the insulation pattern INP, is thicker than the second thickness t2 of the gate insulating film (e.g., the second gate insulating film), provided on the channel area CHA present on the side surface of the insulation pattern INP.

That is, in the electronic device according to an embodiment, the thicknesses of the gate insulating films INS1 and INS2 on the channel area CHA can be adjusted without mask processing.

Figure 11:
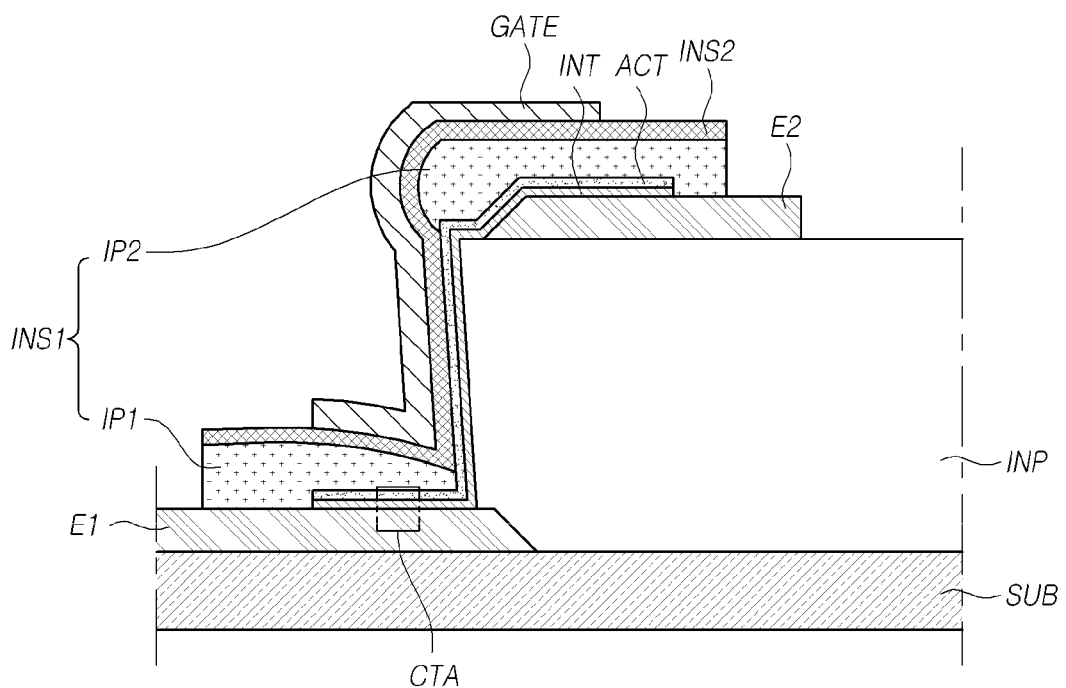
FIG. 11 illustrates a transistor having a vertical structure according to another embodiment.

FIG. 11 illustrates a transistor having a vertical structure according to another embodiment.

Referring to FIG. 11, the transistor TR having a vertical structure can further include an intermediate layer INT disposed on the first electrode E1, a second electrode E2, and an insulation pattern INP, and the intermediate layer INT is disposed below an active layer ACT.

Specifically, the intermediate layer INT and the active layer ACT can be fabricated by applying a material of the intermediate layer INT to the substrate, applying a material of the active layer ACT to the material of the intermediate layer INT, and then patterning the material of the intermediate layer INT and the material of the active layer ACT using a single mask.

The intermediate layer INT can be made of an inorganic material. For example, the intermediate layer INT can include at least one selected from among, but not limited to, $Al_2O_3$, $TiO_2$, $Ga_2O_3$, or $ZnO$.

In addition, the thickness of the intermediate layer INT can be selected from within the range of 10 Å to 30 Å.

The thickness of the intermediate layer INT can be less than the thickness of either the first gate insulating film INS1 and/or the second gate insulating film INS2.

In addition, the active layer ACT can be made of an amorphous silicon (a-Si) semiconductor. The transistor TR including this active layer ACT is referred to as an a-Si transistor.

In another example, the active layer ACT can be made of oxide semiconductor. The transistor TR including this active layer ACT is referred to as an oxide transistor. In this situation, for example, the oxide semiconductor can be an n-type oxide semiconductor, such as indium gallium zinc oxide (IGZO), indium zinc oxide (IZO), or indium titanium zinc oxide (ITZO), or can be a p-type oxide semiconductor, such as CuOx, SnOx, or NiOx.

The intermediate layer INT includes an area in contact with the first electrode E1 and the active layer ACT and an area in contact with the second electrode E2 and the active layer ACT.

The contact area (CTA) of FIG. 11 will be described hereinafter with reference to FIG. 12.

Figure 12:
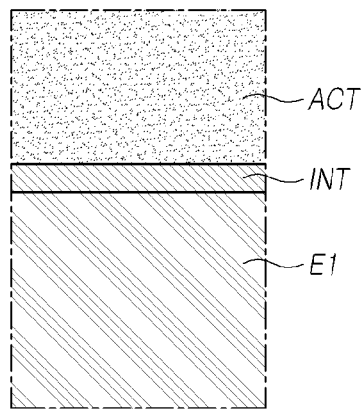
FIG. 12 illustrates the contact area in FIG. 11 according to an embodiment.

FIG. 12 illustrates the contact area CTA in FIG. 11.

Referring to FIG. 12, the contact area CTA in an area in which the first electrode E1 contacts the active layer ACT by metal-insulator-semiconductor (MIS) contact while the second electrode E2 contacts the active layer ACT by MIS contact.

In the situation of direct contact between metal and semiconductor, contact resistance is increased, due to a high Schottky barrier. However, when a thin gate insulating film is inserted between metal and semiconductor (MIS contact), direct contact between metal and a semiconductor can be removed, thereby preventing an increase in contact resistance.

Referring to FIG. 12, the intermediate layer INT is disposed between the first electrode E1 and the active layer ACT. The intermediate layer INT is disposed between the second electrode E2 and the active layer ACT.

Even in the situation that the intermediate layer INT, made of an inorganic insulating material, is present between the first electrode E1 and the active layer ACT, contact resistance between the first electrode S and the active layer ACT can be lowered, due to the MIS contact principle, since the intermediate layer INT is fabricated to be very thin by a deposition method, such as MOCVD or ALD.

Likewise, even in the situation that the intermediate layer INT, made of an inorganic insulating material, is present between the second electrode E2 and the active layer ACT, contact resistance between the second electrode E2 and the active layer ACT can be lowered, due to the MIS contact principle, since intermediate layer INT is fabricated to be very thin.

In addition, in a situation in which the electronic device is a panel PNL or the like, the transistor TR having a vertical structure, illustrated in FIGS. 7, 9, and 11, can be disposed within subpixels SP in the active area, and can be connected to pixel electrodes.

These features will be discussed hereinafter with reference to FIG. 13.

Figure 13:
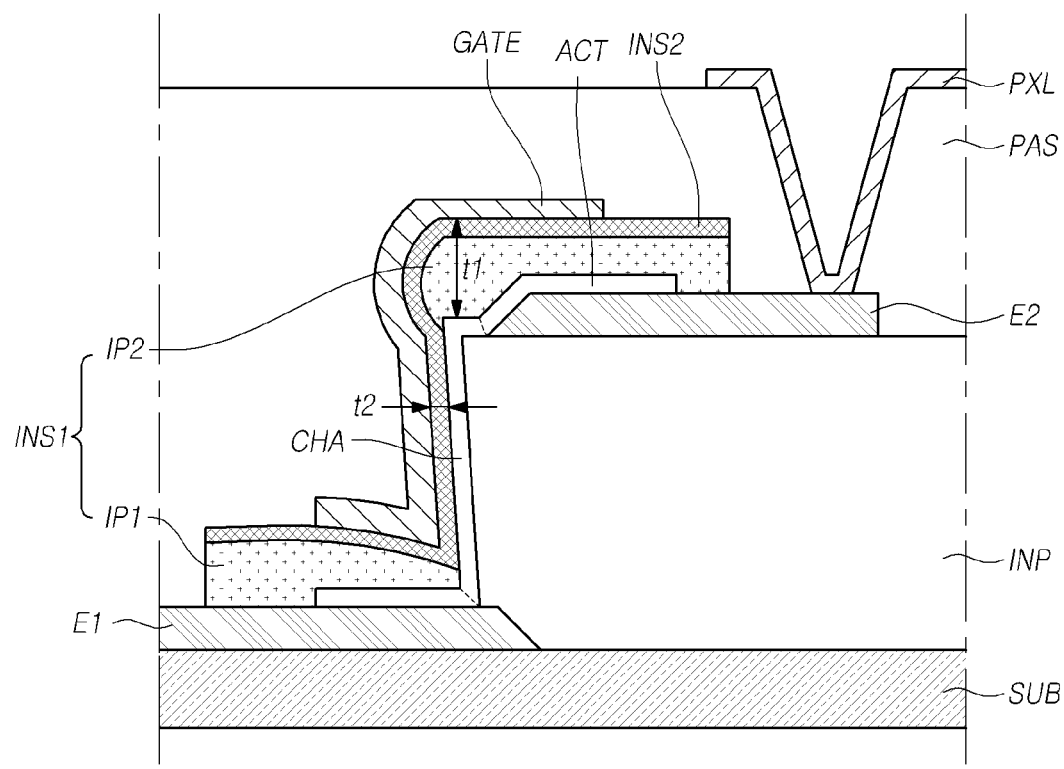
FIG. 13 illustrates a structure connecting the transistor to a pixel electrode, in a subpixel, according to embodiments.

FIG. 13 illustrates a structure connecting the transistor according to embodiments, disposed in a subpixel, to a pixel electrode.

Referring to FIG. 13, among the transistors TR having a vertical structure disposed in a subpixel SP in the active area A/A, there can be a transistor DRT, the second electrode E2 of which is electrically connected to the pixel electrode PXL.

A passivation layer PAS can be provided to cover the gate electrode GATE of the transistor TR. Although the passivation layer PAS is illustrated as being disposed on the gate electrode GATE in FIG. 3 for the sake of brevity, the present disclosure is not limited thereto. Rather, another component, such as another insulating film, can be added between the gate electrode GATE and the passivation layer PAS.

The pixel electrode PXL can be located on the passivation layer PAS. The pixel electrode PXL can be connected to the second electrode E2 via a hole in the passivation layer PAS. Herein, the second electrode E2 can be a source electrode or a drain electrode.

Although the transistor TR according to the present disclosure is illustrated as being disposed in the active area A/A in FIG. 13, the transistor TR according to embodiments can be disposed in the non-active area located in the periphery of the panel PNL.

Since the area occupied by the transistor TR having a vertical structure is smaller than the area occupied by the transistor having a horizontal structure, the size of the non-active area (also referred to as the bezel) can be reduced by using the transistor TR according to embodiments is disposed in the non-active area.

The transistor TR according to embodiments can have a high on-current characteristic, since the active layer ACT has a short channel. The S-factor can be increased by only increasing the thickness of a portion of gate insulating film INS, disposed on the channel area CHA. Accordingly, the effect of increasing the range of available data voltages can be obtained.

In a situation in which the electronic device according to embodiments is an OLED panel PNL, the plurality of transistors TR can be disposed in a subpixel SP in the active area A/A. At least one transistor TR among the plurality of transistors TR disposed in the subpixel SP can have the structure transistor according to embodiments.

These features will be discussed in detail hereinafter with reference to FIGS. 14 to 17.

FIGS. 14 to 17 illustrate a structure of a plurality of transistors disposed in the subpixel SP.

For the sake of brevity, with regard to FIGS. 14 to 17, descriptions will be mainly focused on a configuration in which three transistors T1, T2, and DR are disposed in a single subpixel SP (see FIG. 4).

Figure 14:
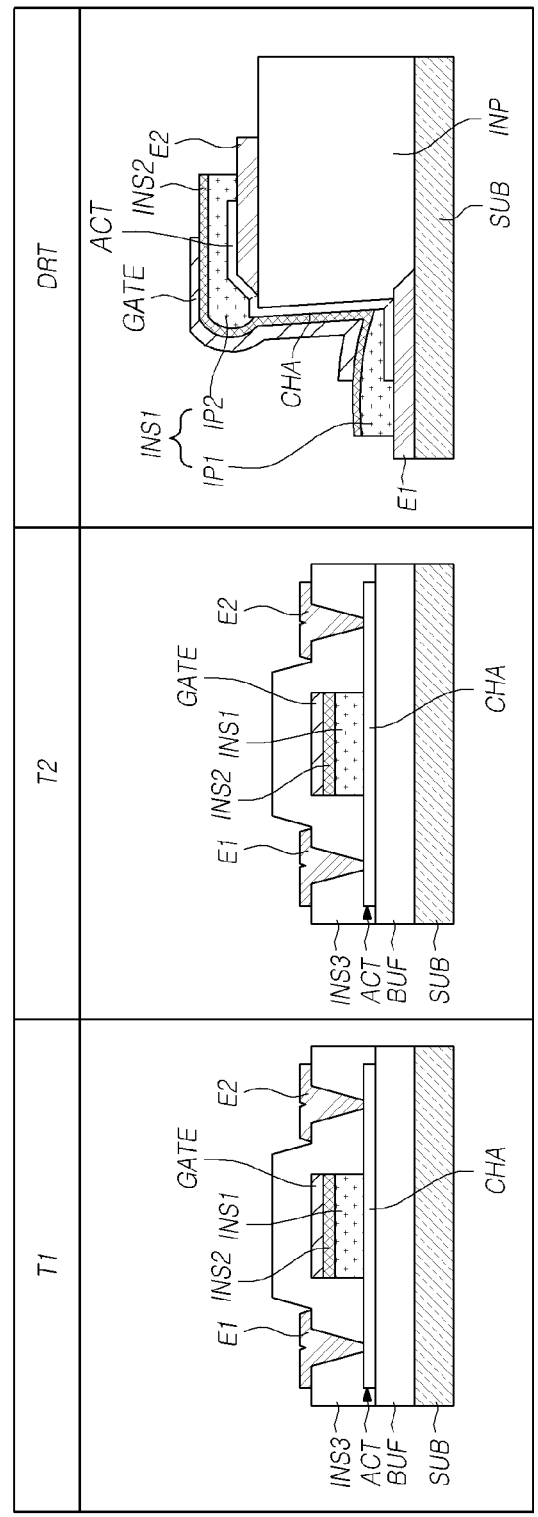
FIGS. 14 to 17 illustrate a structure of a plurality of transistors disposed in the subpixel, according to embodiments.

Referring to FIG. 14, a driving transistor TR can be the transistor TR having a vertical structure according to embodiments.

The first transistor T1 and the second transistor T2 can be transistors having the same type of horizontal structure, different from the vertical structure of the driving transistor TR.

Specifically, in each of the first transistor T1 and the second transistor T2, a buffer layer can be disposed on a substrate SUB, and an active layer ACT can be disposed on the buffer layer BUF.

A first gate insulating film INS1, a second gate insulating film INS2, and a gate electrode GATE can be sequentially layered on the area corresponding to a channel area CHA of the active layer ACT.

An insulating film INS3 is disposed to cover the gate electrode GATE.

A first electrode E1 and a second electrode E2 are disposed on the insulating film INS3, and can contact the active layer ACT via holes created in the insulating film INS3.

Figure 15:
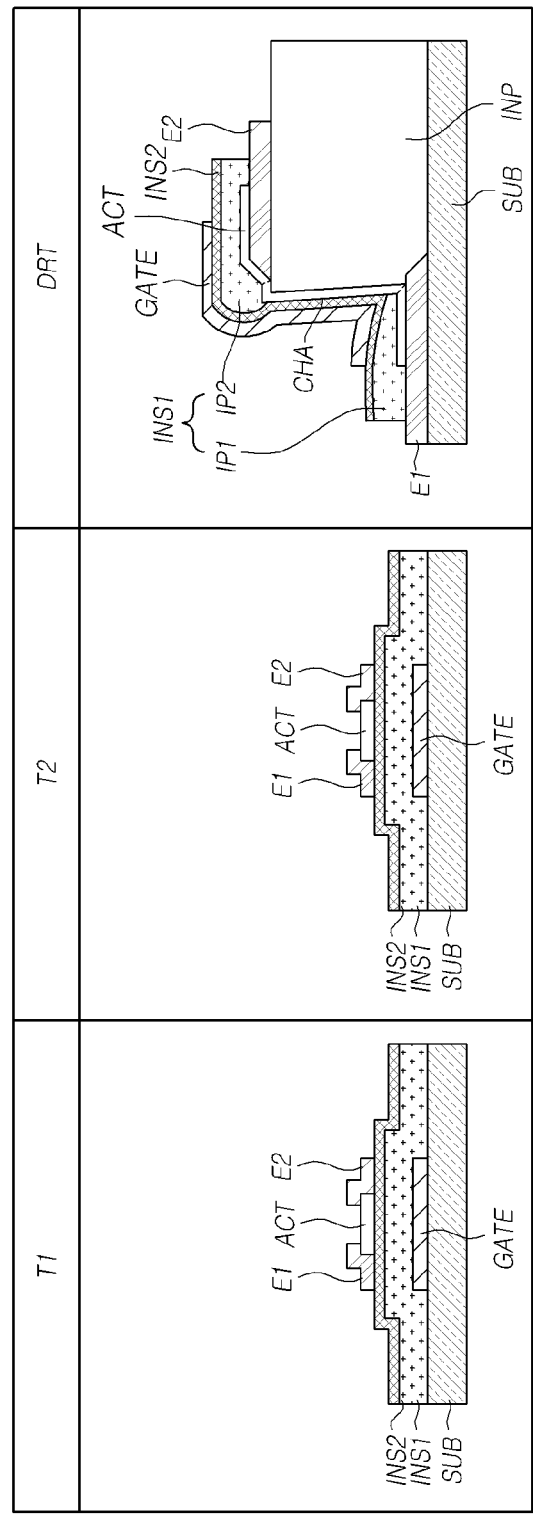

Referring to FIG. 15, a driving transistor TR can be the transistor TR having a vertical structure according to embodiments, while the first transistor T1 and the second transistor T2 can be transistors having a horizontal structure, e.g., the same structure, different from the vertical structure of the driving transistor TR.

Specifically, the structure of the first transistor T1 and the second transistor T2 in FIG. 15 will be discussed as follows.

A gate electrode GATE is disposed on a substrate SUB.

A first gate insulating film INS1 and a second gate insulating film INS2 are sequentially disposed to cover the gate electrode GATE.

An active layer ACT, a first electrode E1, and a second electrode E2 are disposed on the second gate insulating film INS2. One end of the active layer ACT can overlap the first electrode E1, while the other end of the active layer ACT can overlap the second electrode E2.

In addition, an etch stop disposed on the active layer ACT can further be included.

Referring to FIGS. 14 and 15, the transistor TR having a vertical structure according to embodiments can be used as the driving transistor DRT.

As described above, the transistor TR having a vertical structure, having the short channel area of the active layer ACT and a high S-factor, is used as the driving transistor DRT. This can obtain a wider range of available data voltages, so that low-grayscale expressing can be performed more easily (e.g., an effect of an increased operating margin).

Figure 16:
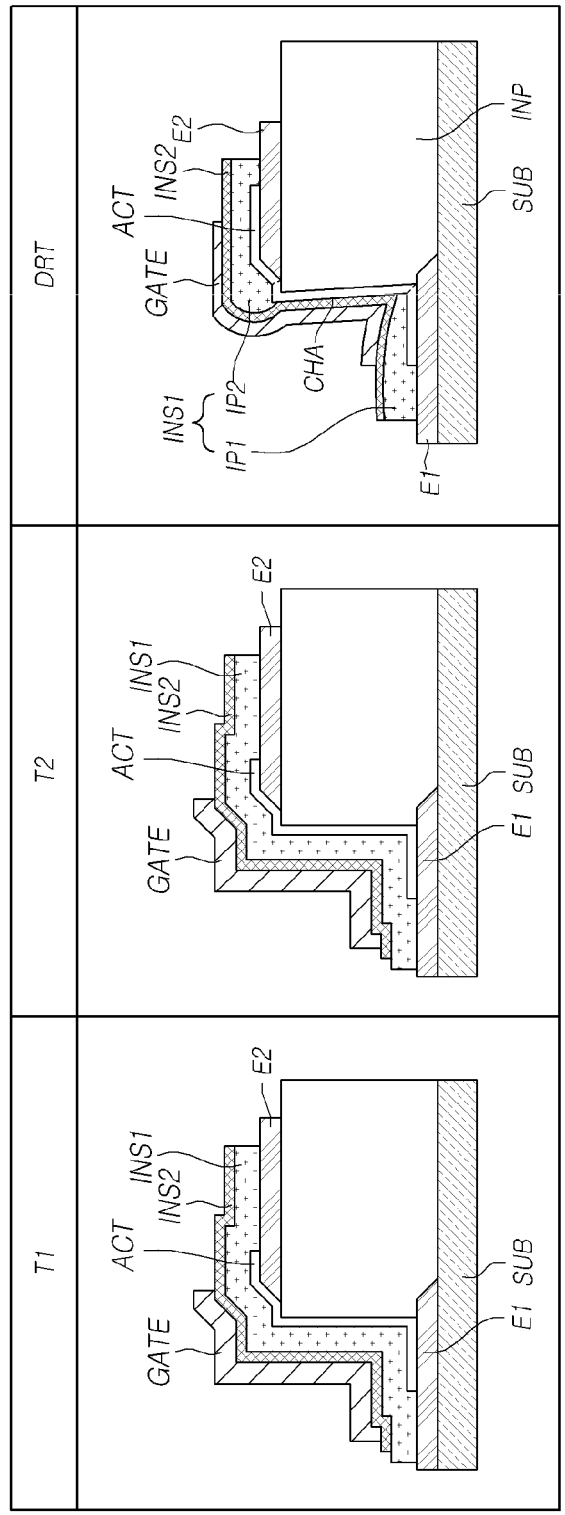

Referring to FIG. 16, the transistor TR having a vertical structure according to embodiments can be used as the driving transistor TR.

The first transistor T1 and the second transistor T2 can be transistors having a horizontal structure, e.g., the same structure, different from the structure of the transistor TR having a vertical structure according to embodiments.

Specifically, in the first transistor T1 and the second transistor T2, a first electrode E1 can be disposed on a substrate SUB, and an insulation pattern INP can be disposed to overlap one end of the first electrode E1.

A second electrode E2 can be disposed on the insulation pattern INP.

An active layer ACT can be disposed such that one end thereof overlaps the first electrode E1 and the other end thereof overlaps the second electrode E2. The active layer ACT can overlap one side surface of the insulation pattern INP.

A first gate insulating film INS1 and a second gate insulating film INS2 can be sequentially disposed to cover the active layer ACT.

A gate electrode GATE can be disposed on the second gate insulating film INS2.

In the first transistor T1 and the second transistor T2, the thicknesses of the first and second gate insulating films INS1 and INS2, disposed between the active layer ACT and the gate electrode GATE, can be uniform in the area corresponding to a channel area CHA.

Figure 17:
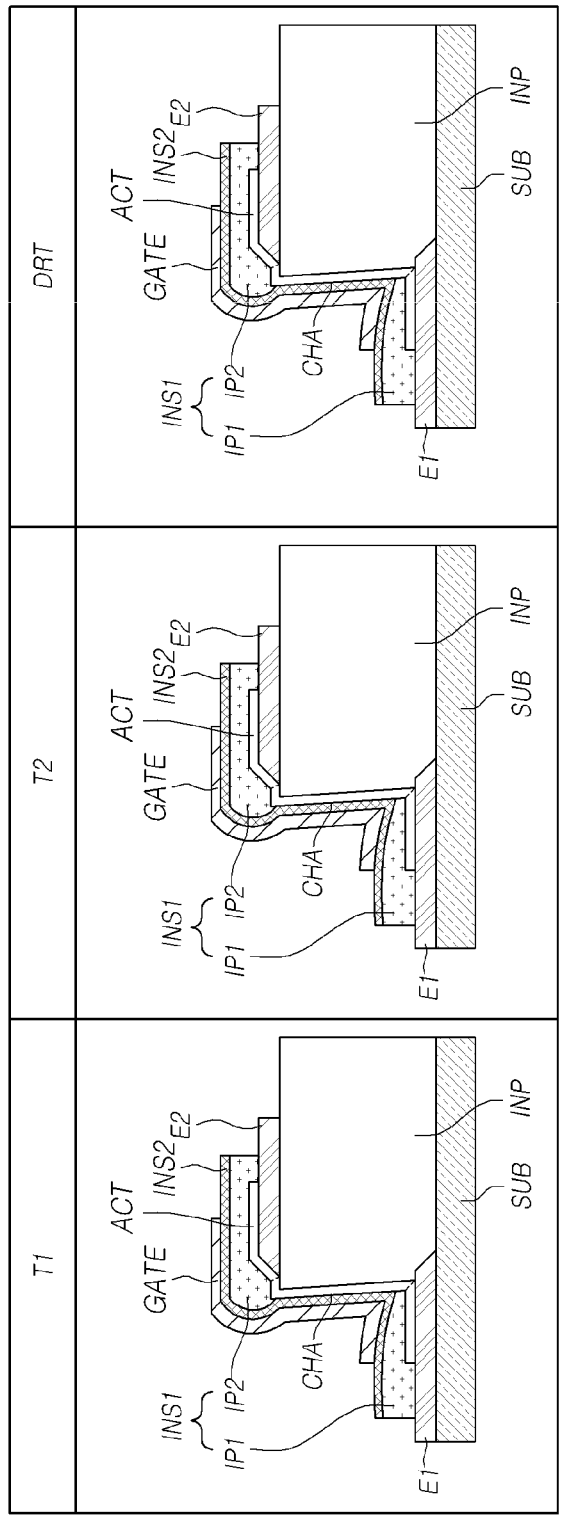

In addition, referring to FIG. 17, each of the driving transistor DRT and the first and second transistors T1 and T2 may be the transistor TR having a vertical structure according to embodiments.

As illustrated in FIGS. 16 and 17, in a situation in which each of the three transistors TR disposed in the subpixel SP has a vertical structure, the areas occupied by the devices can be significantly reduced. Accordingly, it is possible to significantly reduce the size of the subpixel SP, so that an ultra-high resolution panel PNL can be realized.

According to embodiments, the channel area CHA of the active layer ACT can be determined, based on the height of the insulation pattern INP, so that a short channel can be easily realized. In addition, since the transistor having a vertical structure can be provided, the device size can be reduced, and device integration is possible.

In addition, according to embodiments, a portion of the gate insulating film INS2 or INS2, disposed on the channel area CHA, has a different thickness from the remaining portions. Accordingly, in the transistor having a vertical structure and the electronic device, the S-factor of the transistor can be increased, thereby increasing an operating margin.

In addition, according to embodiments, the transistor having a vertical structure and the electronic device can be provided by the MOCVD or ALD method, such that the active layer ACT has no break, e.g., no discontinuity in an electrical circuit.

The MOCVD or ALD method is a deposition method by which a thin film having excellent step-coverage properties can be fabricated. The resultant thin film can have a higher thickness and composition uniformity, as well as a higher level of density, compared to those fabricated by other deposition methods.

In addition, according to embodiments, the second gate insulating film INS2, overlapping the entire channel area CHA of the active layer ACT, can also be fabricated by the MOCVD or ALD method. Accordingly, the second gate insulating film INS2 can be fabricated without a break when the second gate insulating film INS2 having a small thickness is provided on a stepped structure.

In addition, according to embodiments, the use of the transistor having a vertical structure can reduce the device area, thereby realizing an ultra-high resolution panel PNL.

In addition, in the transistor having a vertical structure and the electronic device, according to embodiments, the reduced length of the channel area CHA can increase the driving current of the transistor and reduce the device area, thereby reducing the size of the non-active area.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principles of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. An electronic device comprising:
   a panel;
   a driver circuit configured to drive the panel; and
   a transistor disposed in the panel, the transistor including:
      a first electrode disposed on a substrate,
      an insulation pattern disposed on the substrate, the insulation pattern overlapping with an edge of the first electrode,
      a second electrode disposed on an upper surface of the insulation pattern,
      an active layer disposed on the first electrode, the insulation pattern and the second electrode,
      a gate insulating film disposed on the active layer, and
      a gate electrode disposed on the gate insulating film,
   wherein a first portion of the active layer overlaps with the first electrode, a second portion of the active layer overlaps with the second electrode, and a channel area of the active layer is between the first portion of the active layer and the second portion of the active layer,
   wherein the channel area includes a first channel portion disposed along a side surface of the insulation pattern, and a second channel portion disposed on a portion of the upper surface of the insulation pattern, the second channel portion extending from an edge of the second electrode to the first channel portion, and
   wherein a first portion of the gate insulating film overlaps with the second channel portion and has a first thickness, and a second portion of the gate insulating film is disposed along the side surface of the insulation pattern and has a second thickness less than the first thickness of the first portion of the gate insulating film.

2. The electronic device according to claim 1, wherein a width of the insulation pattern increases in a direction perpendicularly away from the substrate, or
   wherein the insulation pattern has a reverse tapered shape relative to the substrate.

3. The electronic device according to claim 1, wherein a length of the channel area of the active layer is proportional to a height of the insulation pattern.

4. The electronic device according to claim 1, wherein the gate insulating film includes:
   a first gate insulating film disposed on an upper surface of the active layer and overlapping with portions of the first and second electrodes; and
   a second gate insulating film disposed on the first gate insulating film and overlapping with the channel area of the active layer.

5. The electronic device according to claim 4, wherein the first gate insulating film overlaps with the channel area in a vertical direction relative to the substrate.

6. The electronic device according to claim 4, wherein the first gate insulating film exposes a portion of the active layer along the side surface of the insulation pattern.

7. The electronic device according to claim 4, wherein the first gate insulating film is disposed on an entirety of channel area of the active layer, and
wherein a thickness of the first gate insulating film disposed on the first channel portion is thinner than a thickness of the first gate insulating film disposed on the second channel portion.

8. The electronic device according to claim 4, wherein the first gate insulating film includes:
a first area overlapping the first portion of the active layer and a portion of the first electrode; and
a second area overlapping the second portion of the active layer and a portion of the second electrode.

9. The electronic device according to claim 8, wherein the second area of the first gate insulating film is disposed on the second channel portion of the channel area.

10. The electronic device according to claim 8, wherein the first gate insulating film includes:
a third area overlapping the first channel portion of the active layer, and
wherein the third area exposes a portion of the first channel portion of the active layer.

11. The electronic device according to claim 4, wherein a thickest area of the second gate insulating film is thinner than a thickest area of the first gate insulating film.

12. The electronic device according to claim 4, wherein the second gate insulating film is denser than the first gate insulating film, and
wherein the second gate insulating film has less thickness variation than the first gate insulating film, or the second gate insulating film has a more uniform thickness than the first gate insulating film.

13. The electronic device according to claim 1, wherein the active layer includes an amorphous silicon semiconductor or an oxide semiconductor.

14. The electronic device according to claim 1, further comprising:
an intermediate layer disposed on the first electrode, the insulation pattern and the second electrode,
wherein the intermediate layer is disposed under the active layer.

15. The electronic device according to claim 14, wherein a thickness of the intermediate layer is less than both a thickness of a first gate insulating film and a thickness of a second gate insulating film disposed on the first insulating film disposed on an upper surface of the active layer.

16. The electronic device according to claim 1, wherein the transistor is disposed in an active area of the panel,
wherein a passivation layer covers the gate electrode of the transistor, and
wherein a pixel electrode is located on the passivation layer to be electrically connected to the first electrode or the second electrode through a hole in the passivation layer.

17. The electronic device according to claim 1, wherein each of a plurality of subpixels in an active area of the panel includes the transistor of claim 1.

18. The electronic device according to claim 1, wherein the transistor is included in a gate driver circuit disposed in a non-active area of the panel, in a periphery of the active area.

19. The electronic device according to claim 1, further comprising:
a second transistor disposed on the substrate,
wherein the second transistor includes:
a third electrode disposed on the substrate;
a fourth electrode disposed on the substrate, the fourth electrode disposed on a second insulation pattern overlapping with a portion of the third electrode;
a second active layer connected between the third electrode and the fourth electrode, and including a second channel area disposed along a side surface of the second insulation pattern;
the gate insulating film of the second transistor disposed on the second active layer; and
a second gate electrode disposed on the gate insulating film,
wherein the second active area of the second transistor extends from the second channel area over the third electrode and the fourth electrode, and
wherein a thickness of the second gate electrode of the second transistor, disposed on the channel area of the second active layer, is same as a thickness of the second gate electrode of the second transistor, disposed on the second active area extending over the third electrode and the fourth electrode.

20. A transistor having a vertical structure, comprising:
a first electrode disposed on a substrate;
an insulation pattern disposed on the substrate, the insulation pattern overlapping with an edge of the first electrode;
a second electrode disposed on an upper surface of the insulation pattern;
an active layer disposed on the first electrode, the insulation pattern and the second electrode;
a gate insulating film disposed on the active layer; and
a gate electrode disposed on the gate insulating film,
wherein a first portion of the active layer overlaps with the first electrode, a second portion of the active layer overlaps with the second electrode, and a channel area of the active layer is between the first portion of the active layer and the second portion of the active layer,
wherein the channel area includes a first channel portion disposed along a side surface of the insulation pattern, and a second channel portion disposed on a portion of the upper surface of the insulation pattern, the second channel portion extending from an edge of the second electrode to the first channel portion, and
wherein a first portion of the gate insulating film overlaps with the second channel portion and has a first thickness, and a second portion of the gate insulating film is disposed along the side surface of the insulation pattern and has a second thickness less than the first thickness of the first portion of the gate insulating film.

* * * * *